(12) United States Patent
Odnoblyudov et al.

(10) Patent No.: US 10,438,792 B2
(45) Date of Patent: Oct. 8, 2019

(54) METHODS FOR INTEGRATION OF ELEMENTAL AND COMPOUND SEMICONDUCTORS ON A CERAMIC SUBSTRATE

(71) Applicant: QROMIS, Inc., Santa Clara, CA (US)

(72) Inventors: Vladimir Odnoblyudov, Danville, CA (US); Cem Basceri, Los Gatos, CA (US); Shari Farrens, Boise, ID (US); Ozgur Aktas, Pleasanton, CA (US)

(73) Assignee: Qromis, Inc., Santa Clara, CA (US)

( * ) Notice: Subject to any disclaimer, the term of this patent is extended or adjusted under 35 U.S.C. 154(b) by 0 days.

(21) Appl. No.: 15/788,597

(22) Filed: Oct. 19, 2017

(65) Prior Publication Data

US 2018/0114693 A1 Apr. 26, 2018

Related U.S. Application Data

(60) Provisional application No. 62/410,758, filed on Oct. 20, 2016.

(51) Int. Cl.
*C30B 25/18* (2006.01)
*C30B 29/06* (2006.01)
(Continued)

(52) U.S. Cl.
CPC .......... *H01L 21/0242* (2013.01); *C30B 25/18* (2013.01); *C30B 29/06* (2013.01); *C30B 29/406* (2013.01); *H01L 21/0243* (2013.01); *H01L 21/0245* (2013.01); *H01L 21/0254* (2013.01); *H01L 21/02458* (2013.01); *H01L 21/02488* (2013.01); *H01L 21/02505* (2013.01); *H01L 21/02516* (2013.01); *H01L 21/02639* (2013.01); *H01L 21/8252* (2013.01); *H01L 21/8258* (2013.01); *H01L 21/823871* (2013.01);
(Continued)

(58) Field of Classification Search
CPC ............ H01L 33/0066; H01L 21/0254; H01L 21/02532
See application file for complete search history.

(56) References Cited

U.S. PATENT DOCUMENTS

| | | | |
|---|---|---|---|
| 9,806,615 B1* | 10/2017 | Deligianni | H01L 27/1203 |
| 2007/0134891 A1* | 6/2007 | Adetutu | H01L 21/76254 438/464 |

(Continued)

*Primary Examiner* — Samuel A Gebremariam
*Assistant Examiner* — Jonas T Beardsley
(74) *Attorney, Agent, or Firm* — Kilpatrick Townsend & Stockton LLP

(57) ABSTRACT

A method of fabricating a semiconductor structure includes providing an engineered substrate including a polycrystalline substrate, a barrier layer encapsulating the polycrystalline substrate, and a bonding layer coupled to the barrier layer. The method further includes forming a first silicon layer coupled to the bonding layer, forming a dielectric layer coupled to the first silicon layer, forming a second silicon layer coupled to the dielectric layer, removing a portion of the second silicon layer and a corresponding portion of the dielectric layer to expose a portion of the first silicon layer, forming a gallium nitride (GaN) layer coupled to the exposed portion of the first silicon layer, forming a gallium nitride (GaN) based device coupled to the GaN layer, and forming a silicon-based device coupled to a remaining portion of the second silicon layer.

19 Claims, 19 Drawing Sheets

(51) Int. Cl.
*C30B 29/40* (2006.01)
*H01L 21/02* (2006.01)
*H01L 27/06* (2006.01)
*H01L 29/16* (2006.01)
*H01L 29/20* (2006.01)
*H01L 21/762* (2006.01)
*H01L 23/522* (2006.01)
*H01L 27/092* (2006.01)
*H01L 21/8238* (2006.01)
*H01L 21/8252* (2006.01)
*H01L 21/8258* (2006.01)

(52) U.S. Cl.
CPC ...... *H01L 23/5221* (2013.01); *H01L 27/0605* (2013.01); *H01L 27/0617* (2013.01); *H01L 27/092* (2013.01); *H01L 29/16* (2013.01); *H01L 29/2003* (2013.01); *H01L 21/02532* (2013.01); *H01L 21/76254* (2013.01)

(56) References Cited

U.S. PATENT DOCUMENTS

| | | | |
|---|---|---|---|
| 2011/0101373 A1* | 5/2011 | Arena | H01L 33/00 257/76 |
| 2011/0180857 A1* | 7/2011 | Hoke | H01L 21/76251 257/255 |
| 2014/0183442 A1* | 7/2014 | Odnoblyudov | H01L 33/0079 257/13 |

* cited by examiner

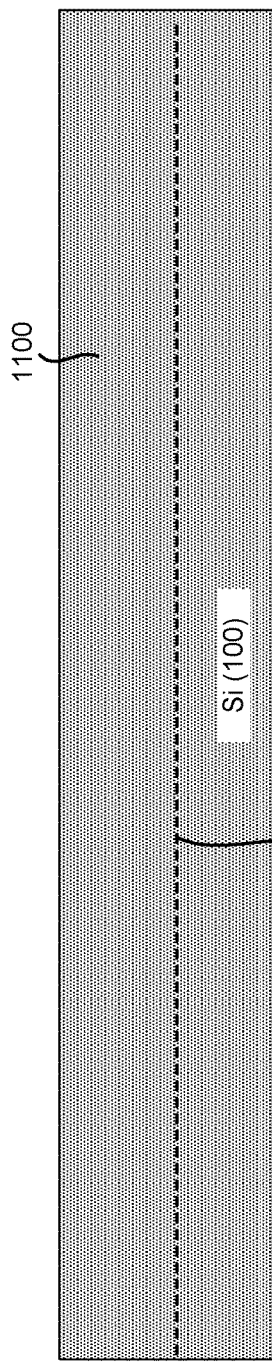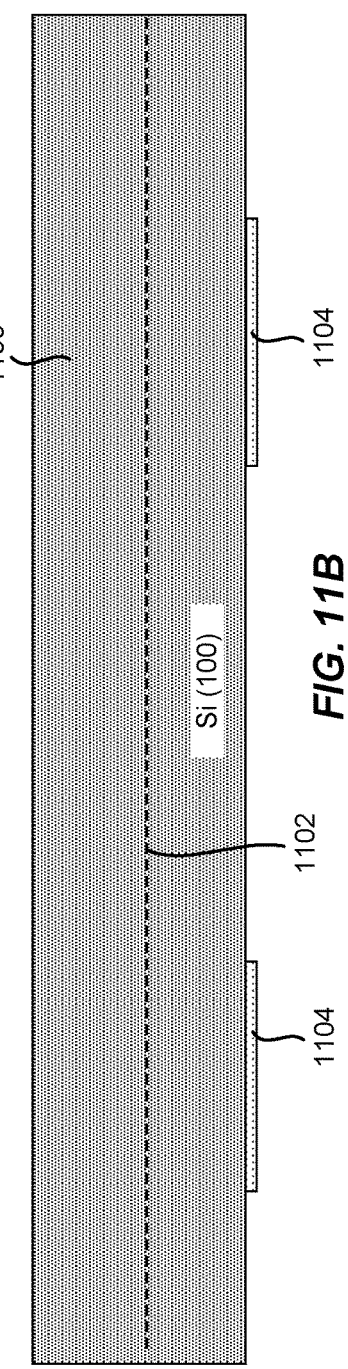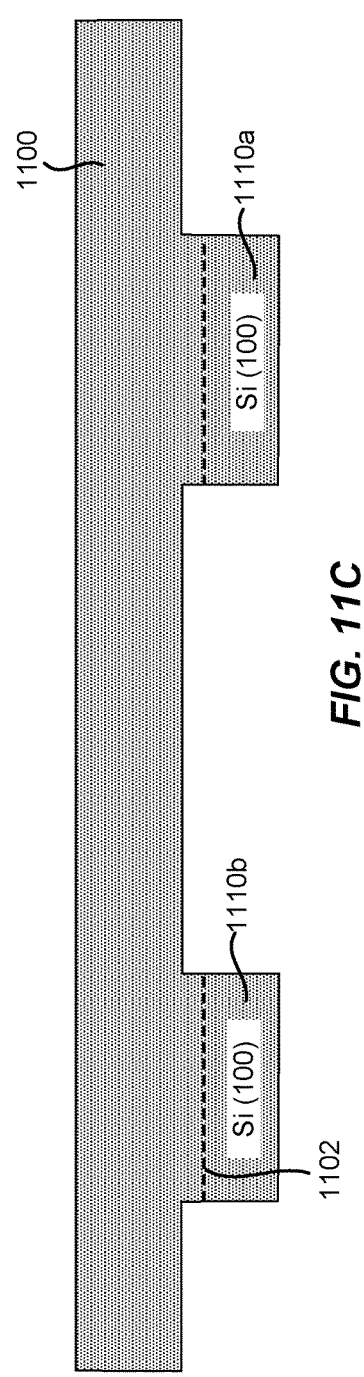

METHODS FOR INTEGRATION OF ELEMENTAL AND COMPOUND SEMICONDUCTORS ON A CERAMIC SUBSTRATE

CROSS-REFERENCES TO RELATED APPLICATIONS

This application claims the benefit of U.S. Provisional Patent Application No. 62/410,758, filed on Oct. 20, 2016, the content of which is incorporated by reference in its entirety.

BACKGROUND OF THE INVENTION

Heteroepitaxy of gallium nitride based compound semiconductors on sapphire, silicon carbide and silicon are currently used in light-emitting diodes (LEDs), high power devices and high speed radio frequency (RF) devices. Applications include lighting, computer monitors, displays, wide band gap communications, automotive and industrial power sources.

The growth of gallium nitride based devices such as LED structures on a sapphire substrate is a heteroepitaxial growth process since the substrate and the epitaxial layers are composed of different materials. Due to the heteroepitaxial growth process, the epitaxially grown material can exhibit a variety of adverse effects, including reduced uniformity and reductions in metrics associated with the electronic/optical properties of the epitaxial layers. Accordingly, there is a need in the art for improved methods and systems related to epitaxial growth processes and substrate structures.

SUMMARY OF THE INVENTION

The present invention relates generally to integration of elemental and compound semiconductors on a ceramic substrate. More specifically, the present invention relates to methods and systems suitable for use in epitaxial growth processes. Merely by way of example, the invention has been applied to methods and systems for integrating GaN based devices and silicon based devices on a ceramic substrate. The invention has been also applied to methods and systems for integrating GaN based devices and III-V compound semiconductor devices on a ceramic substrate. The methods and techniques can be applied to a variety of semiconductor processing operations.

According to an embodiment of the present invention, a method of fabricating a semiconductor structure includes providing an engineered substrate. The engineered substrate includes a polycrystalline substrate, a barrier layer encapsulating the polycrystalline substrate, and a bonding layer coupled to the barrier layer. The method further includes forming a first silicon layer coupled to the bonding layer. The first silicon layer may be substantially single crystalline and may have a surface in a first crystalline orientation. The method further includes forming a dielectric layer coupled to the first silicon layer, and forming a second silicon layer coupled to the dielectric layer. The second silicon layer may be substantially single crystalline and may have a surface in a second crystalline orientation different from the first crystalline orientation. The method further includes removing a portion of the second silicon layer and a corresponding portion of the dielectric layer to expose a portion of the first silicon layer. A remaining portion of the second silicon layer defines a recess above the exposed portion of the first silicon layer. The method further includes forming a gallium nitride (GaN) layer coupled to the exposed portion of the first silicon layer in the recess, forming a gallium nitride (GaN) based device coupled to the GaN layer, and forming a silicon-based device coupled to the remaining portion of the second silicon layer.

According to another embodiment of the present invention, a method of fabricating a semiconductor structure includes providing an engineered substrate. The engineered substrate includes a polycrystalline substrate, a barrier layer encapsulating the polycrystalline substrate, and a bonding layer coupled to the barrier layer. The method further includes forming a first silicon layer coupled to the bonding layer. The first silicon layer may be substantially single crystalline and may have a surface in a first crystalline orientation. The method further includes removing a portion of the first silicon layer to expose a portion of the bonding layer. A remaining portion of the first silicon layer defines a recess above the exposed portion of the bonding layer. The method further includes providing a donor substrate that includes substantially single crystalline silicon and has a front surface in a second crystalline orientation different from the first crystalline orientation. The method further includes removing portions of the donor substrate from the front surface to form a silicon island protruding from a remaining portion of the donor substrate, and bonding the silicon island with the exposed portion of the bonding layer. The silicon island is disposed in the recess, and a sidewall of the silicon island is spaced from a side wall of the recess by a gap. The method further includes removing the remaining portion of the donor substrate to expose a surface of the silicon island having the second crystalline orientation, and filling the gap with a dielectric material.

According to a further embodiment of the present invention, a semiconductor structure includes an engineered substrate. The engineered substrate includes a polycrystalline substrate, a barrier layer encapsulating the polycrystalline substrate, and a bonding layer coupled to the barrier layer. The semiconductor structure further includes a semiconductor layer coupled to the engineered substrate. The semiconductor layer includes a silicon layer that is substantially single crystalline and has a surface in a first crystalline orientation. The silicon layer defines a plurality of recesses exposing a plurality of portions of the bonding layer. The semiconductor layer further includes a plurality of compound semiconductor regions. Each of the plurality of compound semiconductor regions is coupled to a respective exposed portion of the bonding layer in a respective recess.

Several advantages may be realized by taking advantage of the ability to match the coefficient of thermal expansion (CTE) of the substrate to the epitaxial layer and the thin compliant silicon seed layer. For example, the advantages may include extremely low defect density device layers, the ability to grow a broader range of thicknesses on the compliant template materials, and retention of improved thermal performance. Furthermore, the ability to integrate III-V compound semiconductor devices with standard silicon processes can enable integration of complementary metal-oxide-semiconductor (CMOS) devices, RF devices, LEDs, and power devices at a chip level.

These and other embodiments of the invention along with many of its advantages and features are described in more detail in conjunction with the text below and attached figures.

BRIEF DESCRIPTION OF THE DRAWINGS

FIGS. 11A-11C are schematic cross-sectional diagrams illustrating intermediate steps of fabricating a semiconductor structure according to another embodiment of the present invention.

DETAILED DESCRIPTION OF SPECIFIC EMBODIMENTS

Embodiments of the present invention relate to integration of elemental and compound semiconductors on a ceramic substrate. More specifically, the present invention relates to methods and systems suitable for use in epitaxial growth processes. Merely by way of example, the invention has been applied to methods and systems for integrating GaN based devices and silicon based devices on a ceramic substrate. The invention has been also applied to methods and systems for integrating GaN based devices and III-V compound semiconductor devices on a ceramic substrate. The methods and techniques can be applied to a variety of semiconductor processing operations.

Figure 1:
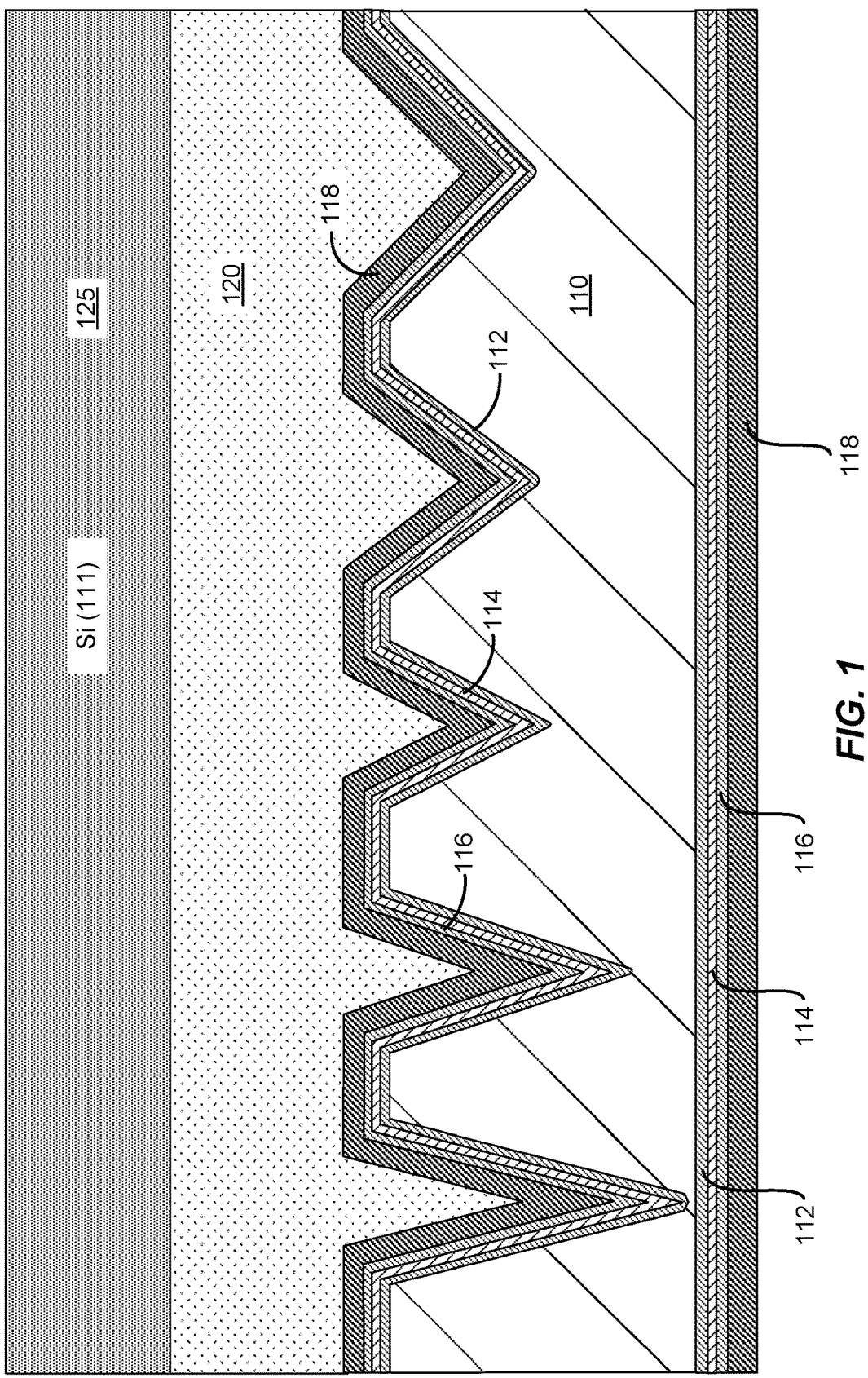
FIG. 1 is a schematic cross-sectional diagram illustrating an engineered substrate structure according to an embodiment of the present invention.

FIG. 1 is a simplified schematic diagram illustrating an engineered substrate structure according to an embodiment of the present invention. As illustrated in FIG. 1, the engineered substrate structure may be suitable for a variety of electronic and optical applications. The engineered substrate structure includes a core 110 (e.g., AlN Substrate) that can have a coefficient of thermal expansion (CTE) that is substantially matched to the CTE of the epitaxial material that will be grown on the engineered substrate structure, for example, on the exfoliated silicon (111) layer 125.

For applications including the growth of gallium nitride (GaN)-based materials (epitaxial layers including GaN-based layers), the core 110 can be a polycrystalline ceramic material, for example, polycrystalline aluminum nitride (AlN), which can include a binding material such as yttrium oxide. Other materials can be utilized in the core, including polycrystalline gallium nitride (GaN), polycrystalline aluminum gallium nitride (AlGaN), polycrystalline silicon carbide (SiC), polycrystalline zinc oxide (ZnO), polycrystalline gallium trioxide ($Ga_2O_3$), and the like.

The thickness of the core 110 can be on the order of 100 to 1,500 μm, for example, 750 μm. The core 110 is encapsulated in an adhesion layer 112 that can be referred to as a shell or an encapsulating shell. In an embodiment, the adhesion layer 112 comprises a tetraethyl orthosilicate (TEOS) oxide layer on the order of 1,000 Å in thickness. In other embodiments, the thickness of the adhesion layer 112 varies, for example, from 100 Å to 2,000 Å. Although TEOS oxides are utilized for adhesion layers 112 in some embodiments, other materials that provide for adhesion between later deposited layers and underlying layers or materials (e.g., ceramics, in particular, polycrystalline ceramics) can be utilized according to an embodiment of the present invention. For example, $SiO_2$ or other silicon oxides ($Si_xO_y$) adhere well to ceramic materials and provide a suitable surface for subsequent deposition, for example, of conductive materials. The adhesion layer 112 completely surrounds the core 110 in some embodiments to form a fully encapsulated core 110 and can be formed using an LPCVD process or other suitable deposition processes, which can be compatible with semiconductor processing and in particular with polycrystalline or composite substrates and layers. The adhesion layer 112 provides a surface on which subsequent layers adhere to form elements of the engineered substrate structure.

In addition to the use of LPCVD processes, spin on glass/dielectrics, furnace-based processes, and the like to form the encapsulating adhesion layer, other semiconductor processes can be utilized according to embodiments of the present invention, including CVD processes or similar deposition processes. As an example, a deposition process that coats a portion of the core 110 can be utilized, the core 110 can be flipped over, and the deposition process could be repeated to coat additional portions of the core 110. Thus, although LPCVD techniques are utilized in some embodiments to provide a fully encapsulated structure, other film formation techniques can be utilized depending on the particular application.

A conductive layer 114 is formed surrounding the adhesion layer 112. In an embodiment, the conductive layer 114 is a shell of polysilicon (i.e., polycrystalline silicon) that is formed surrounding the adhesion layer 112 since polysilicon can exhibit poor adhesion to ceramic materials. In embodiments in which the conductive layer 114 is polysilicon, the thickness of the polysilicon layer can be on the order of 500-5,000 Å, for example, 2,500 Å. In some embodiments, the polysilicon layer can be formed as a shell to completely surround the adhesion layer 112 (e.g., a TEOS oxide layer), thereby forming a fully encapsulated adhesion layer 112, and can be formed using an LPCVD process. In other embodiments, as discussed below, the conductive material can be formed on a portion of the adhesion layer 112, for example, a lower half of the substrate structure. In some embodiments, conductive material can be formed as a fully encapsulating layer and subsequently removed on one side of the substrate structure.

In an embodiment, the conductive layer 114 can be a polysilicon layer doped to provide a highly conductive material, for example, doped with boron to provide a p-type polysilicon layer. In some embodiments, the doping with boron is at a level of $1 \times 10^{19}$ cm$^{-3}$ to $1 \times 10^{20}$ cm$^{-3}$ to provide for high conductivity. Other dopants at different dopant concentrations (e.g., phosphorus, arsenic, bismuth, or the like at dopant concentrations ranging from $1 \times 10^{16}$ cm$^{-3}$ to $5 \times 10^{18}$ cm$^{-3}$) can be utilized to provide either n-type or p-type semiconductor materials suitable for use in the conductive layer 114. One of ordinary skill in the art would recognize many variations, modifications, and alternatives.

The presence of the conductive layer 114 is useful during electrostatic chucking of the engineered substrate to semiconductor processing tools, for example tools with electrostatic chucks (ESC or e-chuck). The conductive layer enables rapid dechucking after processing in the semiconductor processing tools. In embodiments of the present invention, the conductive layer 114 enables electrical contact with the chuck or capacitive coupling to the e-chuck during future processing including bonding. Thus, embodiments of the present invention provide substrate structures that can be processed in manners utilized with conventional silicon wafers. One of ordinary skill in the art would recognize many variations, modifications, and alternatives. Additionally, having a substrate structure with high thermal conductivity in combination with the electrostatic chucking may afford better deposition conditions for the subsequent formation of engineered layers and epitaxial layers, as well as for the subsequent device fabrication steps. For example, it may provide desirable thermal profiles that can result in lower stress, more uniform deposition thicknesses, and better stoichiometry control through the subsequent layer formations.

A second adhesion layer 116 (e.g., a TEOS oxide layer on the order of 1,000 Å in thickness) is formed surrounding the conductive layer 114. The second adhesion layer 116 completely surrounds the conductive layer 114 in some embodiments to form a fully encapsulated structure and can be formed using an LPCVD process, a CVD process, or any other suitable deposition process, including the deposition of a spin-on dielectric.

A barrier layer 118, for example, a silicon nitride layer, is formed surrounding the second adhesion layer 116. In an embodiment, the barrier layer 118 is a silicon nitride layer that is on the order of 2,000 Å to 5,000 Å in thickness. The barrier layer 118 completely surrounds the second adhesion layer 116 in some embodiments to form a fully encapsulated structure and can be formed using an LPCVD process. In addition to silicon nitride layers, amorphous materials including SiCN, SiON, AlN, SiC, and the like can be utilized as barrier layers 118. In some implementations, the barrier layer 118 consists of a number of sub-layers that are built up to form the barrier layer 118. Thus, the term barrier layer is not intended to denote a single layer or a single material, but to encompass one or more materials layered in a composite manner. One of ordinary skill in the art would recognize many variations, modifications, and alternatives.

In some embodiments, the barrier layer 118, e.g., a silicon nitride layer, prevents diffusion and/or outgassing of elements present in the core, for example, yttrium (elemental), yttrium oxide (i.e., yttria), oxygen, metallic impurities, other trace elements, and the like into the environment of the semiconductor processing chambers in which the engineered substrate could be present, for example, during a high temperature (e.g., 1,000° C.) epitaxial growth process. Utilizing the encapsulating layers described herein, ceramic materials, including polycrystalline AlN that are designed for non-clean room environments, can be utilized in semiconductor process flows and clean room environments.

Typically, ceramic materials utilized to form the core are fired at temperatures in the range of 1,800° C. It would be expected that this process would drive out a significant amount of impurities present in the ceramic materials. These impurities can include yttrium, which results from the use of yttria as sintering agent, calcium, and other elements and compounds. Subsequently, during epitaxial growth processes, which are conducted at much lower temperatures in the range of 800° C. to 1,100° C., it would be expected that the subsequent diffusion of these impurities would be insignificant. However, contrary to conventional expectations, the inventors have determined that even during epitaxial growth processes at temperatures much less than the firing temperature of the ceramic materials, significant diffusion of elements through the layers of the engineered substrate was present. Thus, embodiments of the present invention integrate the barrier layer 118 into the engineered substrate structure to prevent this undesirable diffusion.

Referring once again to FIG. 1, a bonding layer 120 (e.g., a silicon oxide layer) is deposited on a portion of the barrier layer 118, for example, the top surface of the barrier layer 118, and subsequently used during the bonding of a substantially single crystal layer 125 (e.g., a single crystal silicon layer such as the exfoliated silicon (111) layer illustrated in FIG. 1). The bonding layer 120 can be approximately 1.5 µm in thickness in some embodiments. In some embodiments, the thickness of the bonding layer 120 is 20 nm or more for bond-induced void mitigation. In some embodiments, the thickness of the bonding layer 120 is in the range of 0.75-1.5 µm.

The substantially single crystal layer 125 (e.g., exfoliated Si (111)) is suitable for use as a growth layer during an epitaxial growth process for the formation of epitaxial materials. In some embodiments, the epitaxial material can include a GaN layer 2 µm to 10 µm in thickness, which can be utilized as one of a plurality of layers utilized in optoelectronic, RF, and power devices. In an embodiment, the substantially single crystal layer 125 includes a single crystal silicon layer that is attached to the bonding layer 120 using a layer transfer process.

Figure 2:
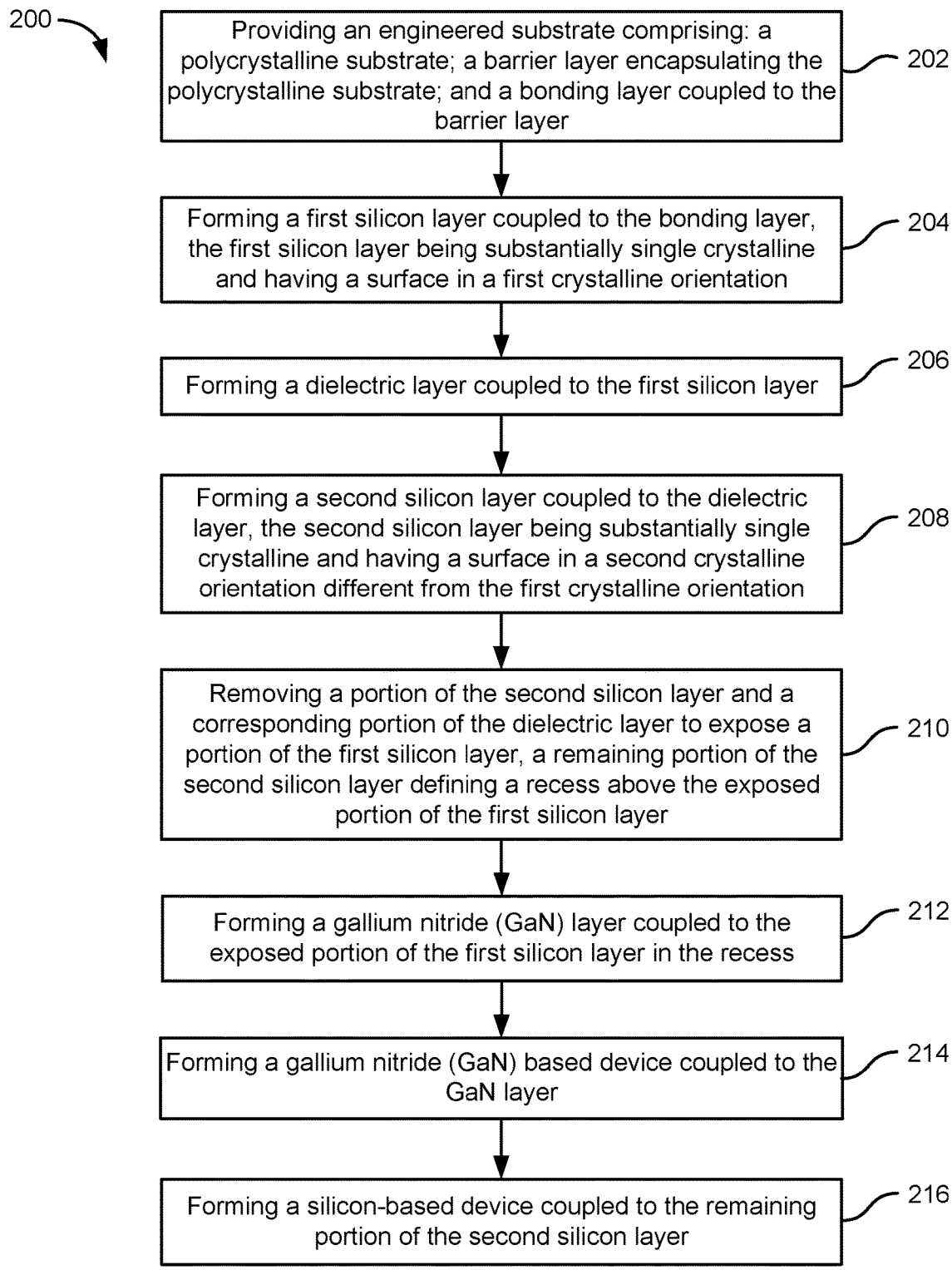
FIG. 2 is a simplified flowchart illustrating a method of fabricating a semiconductor structure according to an embodiment of the present invention.

FIG. 2 is a simplified flowchart illustrating a method of fabricating a semiconductor structure 200 according to an embodiment of the present invention. The method 200 includes, at 202, providing an engineered substrate. With reference to FIG. 1, the engineered substrate may include a polycrystalline ceramic core 110, which can be an aluminum nitride (AlN) substrate that has been cleaned and inspected. Other polycrystalline ceramic cores can be utilized as discussed above. The engineered substrate may further include one or more adhesion layers (e.g., TEOS layers) and/or conductive layers (e.g., polycrystalline silicon layers), as described above.

The engineered substrate may further include a barrier layer 118 encapsulating the polycrystalline ceramic core 110. The barrier layer 118 can be a single layer of silicon nitride, for example, approximately 400 nm in thickness. As described herein, embodiments of the present invention can utilize a variety of materials for the barrier layer 118, including a variety of dielectrics such as $Si_xO_y$, $Si_xN_y$, $Si_xO_yN_z$, diamond like carbon (DLC), combinations thereof, and the like. Other materials, such as Ti, TiW, Ta, and TiN encapsulated in dielectrics, may also be used. One of ordinary skill in the art would recognize many variations, modifications, and alternatives.

The engineered substrate may further include a bonding layer 120 coupled to the barrier layer. In some embodiments, the bonding layer 120 may be a silicon oxide layer deposited on the barrier layer 118 by PECVD. The deposition of the bonding layer 120 can include deposition of a bonding material followed by planarization processes. In some embodiments, the bonding layer 120 can be formed by a deposition (e.g., PECVD) of a thick (e.g., 4 µm thick) oxide layer followed by a chemical mechanical polishing (CMP) process to thin the oxide to approximately 1.5 µm in thickness. The thick initial oxide serves to fill voids and surface features present on the support structure that may be present after fabrication of the polycrystalline core 110 and continue to be present as the encapsulating layers are formed. The CMP process provides a substantially planar surface free of voids, particles, or other features, which can then be used during a wafer transfer process to bond the substantially single crystal layer 125 represented by the exfoliated single crystal silicon (e.g., (111) Si) layer illustrated in FIG. 1 to the bonding layer 120. It will be appreciated that the bonding layer 120 does not have to be characterized by an atomically flat surface, but should provide a substantially planar surface that will support bonding of the substantially single crystal layer 125 (e.g., a single crystal silicon layer) with the desired reliability.

Additional description related to the engineered substrate structure is provided in U.S. patent application Ser. No. 15/621,335, filed on Jun. 13, 2017 and U.S. patent application Ser. No. 15/621,235, filed on Jun. 13, 2017, the disclosures of which are hereby incorporated by reference in their entirety for all purposes.

The method 200 may further include, at 204, forming a first silicon layer 125 coupled to the bonding layer. The first silicon layer 125 may be substantially single crystalline, and having a surface in a first crystalline orientation, such as the (111) orientation of silicon. The first silicon layer 125 may be formed by a layer transfer process in which a single crystal silicon layer is transferred from a silicon wafer. An example of a layer transfer process that can be used to join a substantially single crystal layer to the bonding layer is the bonding of a hydrogen implanted donor wafer (e.g., a silicon wafer including a substantially single crystal layer (e.g., a single crystal silicon layer) that is implanted to form a cleave plane) to the bonding layer 120. The hydrogen implantation may or may not include a co-implant species, such as helium. The bonded pair is then annealed at an annealing temperature (e.g., 200° C.) for an annealing period (e.g., 4 hours) to cluster the implant species (e.g., hydrogen) into blisters. After annealing, the donor wafer fractures along the cleave plane and exfoliates a layer of substantially single crystal material onto the bonding layer 120. As illustrated in FIG. 1, the layer of Si (111) is exfoliated onto the PECVD bonding layer 120. The exfoliated silicon layer 125 may have a thickness that is less than about 1 µm, for example from about 300 nm to about 500 nm. In some embodiments, the exfoliated silicon layer 125 may be smoothed and thinned. Smoothing and thinning may be performed by thermal oxidation and selective oxide stripping. In some embodiments, the exfoliated silicon layer 125 may also be thickened to a desired thickness by epitaxial growth after it has been smoothed. One of ordinary skill in the art would recognize many variations, alternatives, and modifications.

Figure 3:
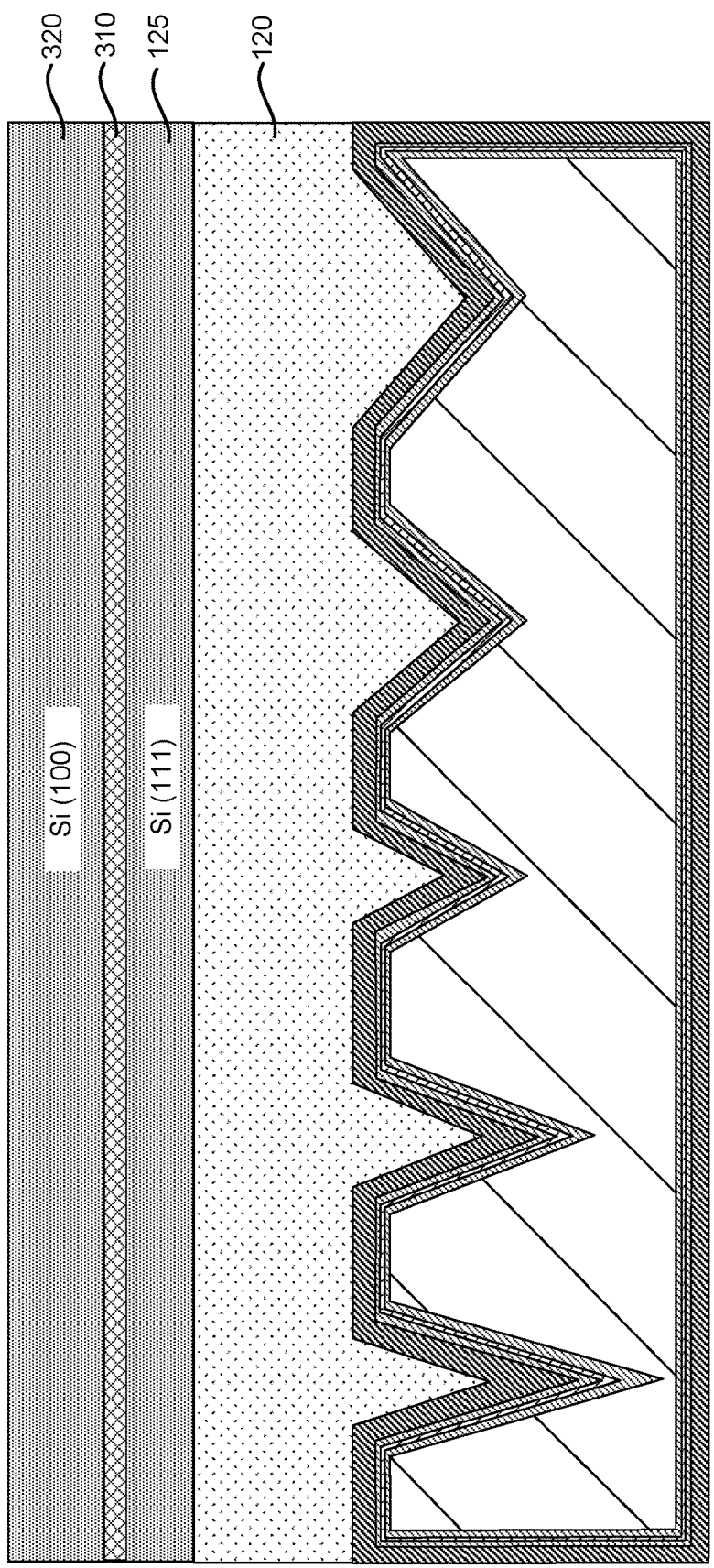
FIG. 3 is a schematic cross-sectional diagram illustrating an intermediate step of fabricating a semiconductor structure according to an embodiment of the present invention.

The method 200 may further include, at 206, forming a dielectric layer 310 coupled to the first silicon layer, as illustrated in FIG. 3. The dielectric layer 310 can be a high quality thermal oxide, a nitride, or the like. The dielectric layer 310 may be formed by one of several deposition methods, such as LPCVD, PECVD or sputter oxides, LPCVD and PECVD nitrides of various stoichiometries, spin on dielectrics or glasses such as BPSG. One of ordinary skill in the art would recognize many variations, alternatives, and modifications. The dielectric layer 310 may have a thickness ranging from about 10 nm to about 20 nm according to some embodiments. The method 200 may further include, at 208, forming a second silicon layer 320 coupled to the dielectric layer 310, as illustrated in FIG. 3. The second silicon layer 320 may be substantially single crystalline, and having a surface in a second crystalline orientation different from the first crystalline orientation of the first silicon layer 125. For example, the second crystalline orientation can be the (100) orientation of silicon. The second silicon layer 320 can be formed by a layer transfer process in which a single crystal silicon layer is transferred from a silicon wafer, as described above. In some embodiments, the second silicon layer 320 (e.g., the (100) silicon layer) may be smoothed and then thickened by epitaxial growth as needed. In one embodiment, the second silicon layer 320 has a thickness of about 5 µm, about the same thickness as the gallium nitride (GaN) layer to be subsequently grown on the Si (111) layer as described below.

Figure 4:
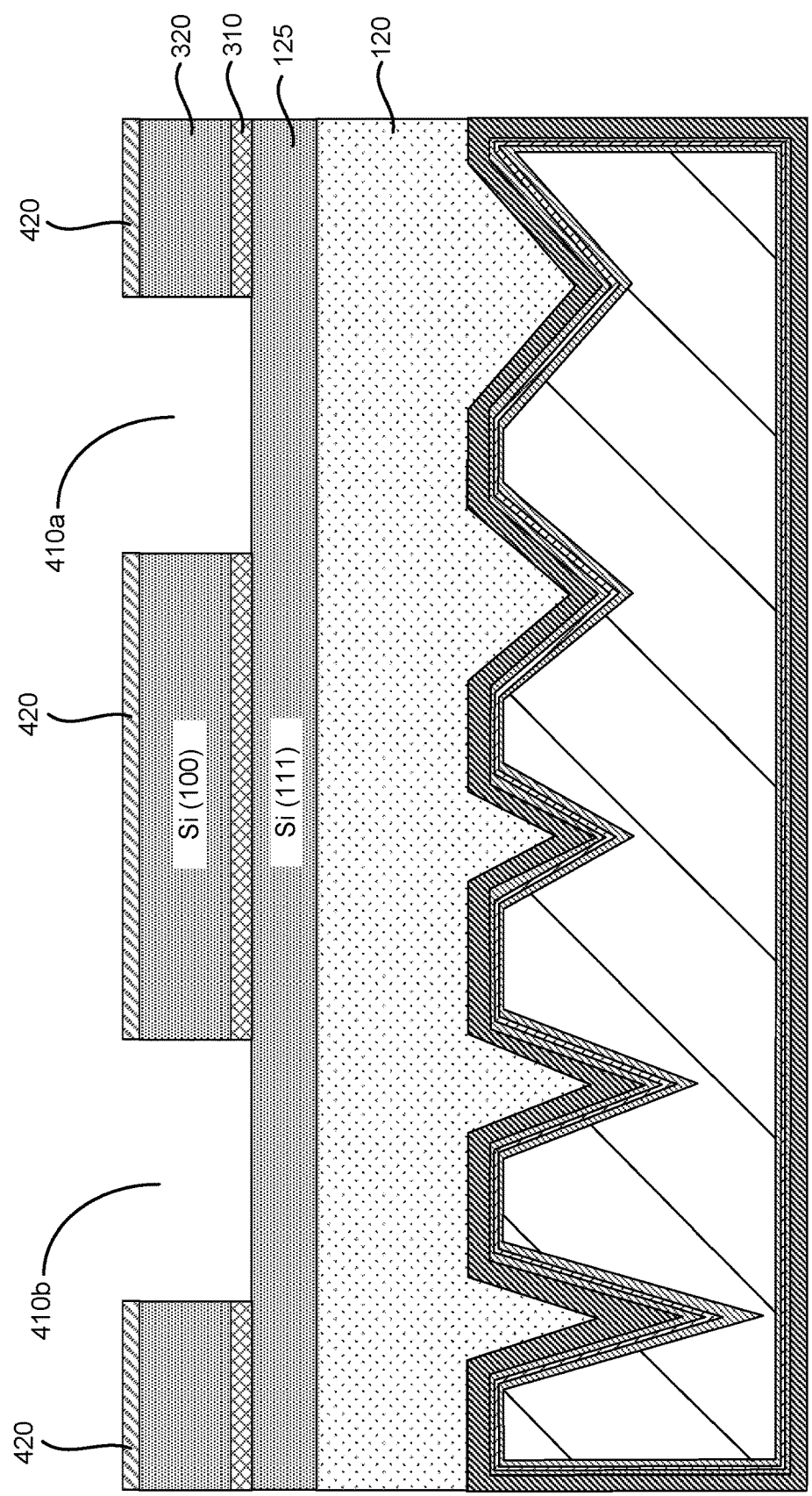
FIG. 4 is a schematic cross-sectional diagram illustrating an intermediate step of fabricating a semiconductor structure according to an embodiment of the present invention.
Figure 5:
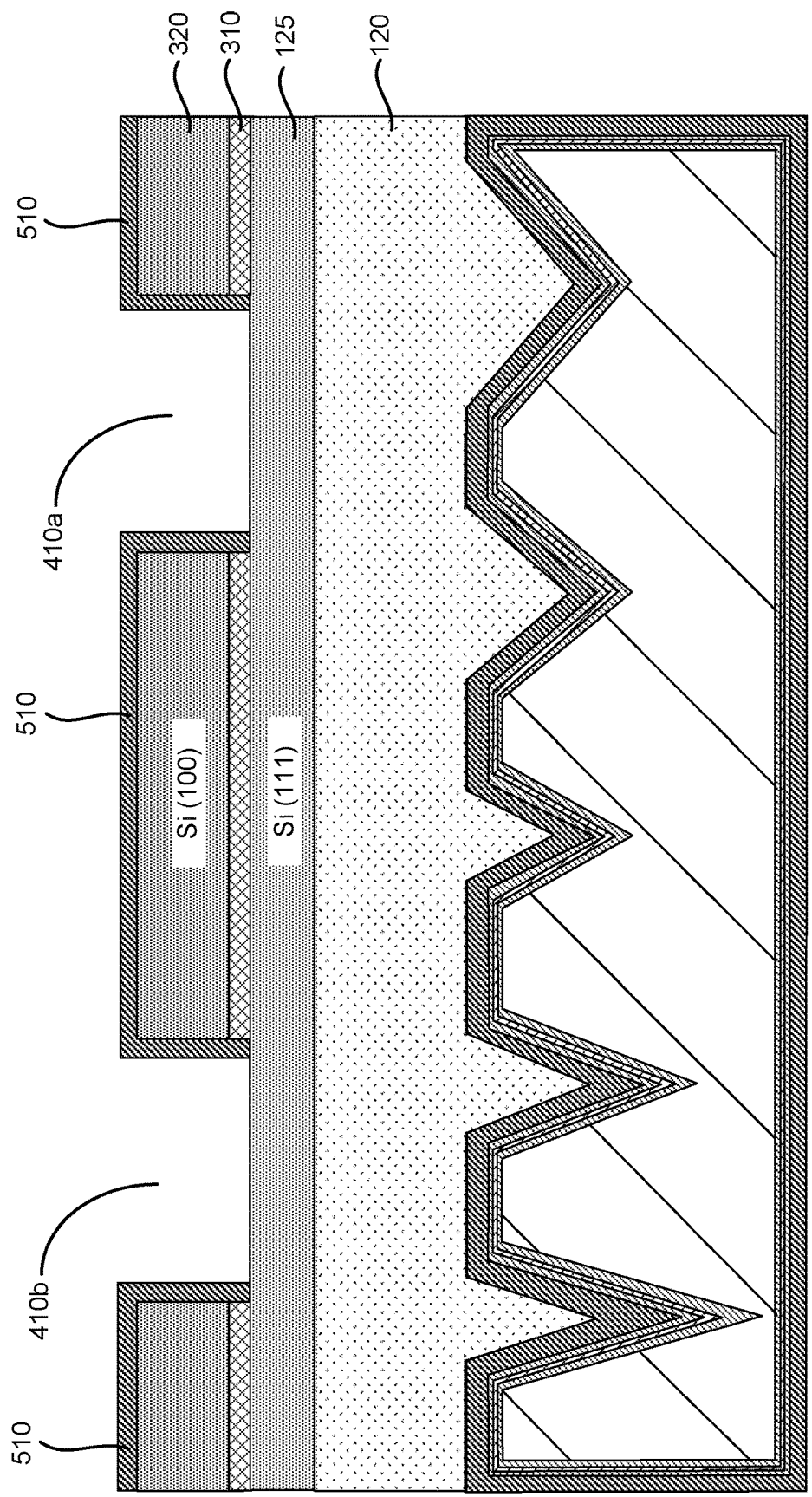
FIG. 5 is a schematic cross-sectional diagram illustrating an intermediate step of fabricating a semiconductor structure according to an embodiment of the present invention.

The method 200 may further include, at 210, removing a portion of the second silicon layer 320 and a corresponding portion of the dielectric layer 310 to expose a portion of the first silicon layer 125, as illustrated in FIG. 4. In some embodiments, a patterned photoresist layer 420 is formed on the second silicon layer 320 (e.g., the (100) silicon layer). The patterned photoresist layer 420 exposes areas of the second silicon layer 320 to be removed. Then dry etching may be performed to remove the portions of the second silicon layer 320 not covered by the photoresist layer 420. In some embodiments, wet etching, for example using KOH or TMAH, may be used to remove the portions of the second silicon layer not covered by the photoresist layer. Etching may be stopped at the dielectric layer. A wet etching, for example using a dilute HF solution, may be performed to remove the exposed portions of the dielectric layer 310 to expose the underlying first silicon layer 125 (e.g., the (111) silicon layer). In this fashion, a plurality of recesses 410a and 410b may be formed in the second silicon layer 320, exposing a plurality of areas of first silicon layer 125. The method may further include covering the sidewalls of the recesses 410a and 410b and the top of the remaining portion of the second silicon layer 320 with a hard mask 510, such as an oxide or a nitride, as illustrated in FIG. 5, to prevent sidewall nucleation in the subsequent epitaxial growth. The hard mask 510 may also cover the bottom of the recesses 410a and 410b. The portion of the mask 510 over the bottom of the recesses 410a and 410b may need to be removed by etching to expose the Si (111) layer. 320

Figure 6:
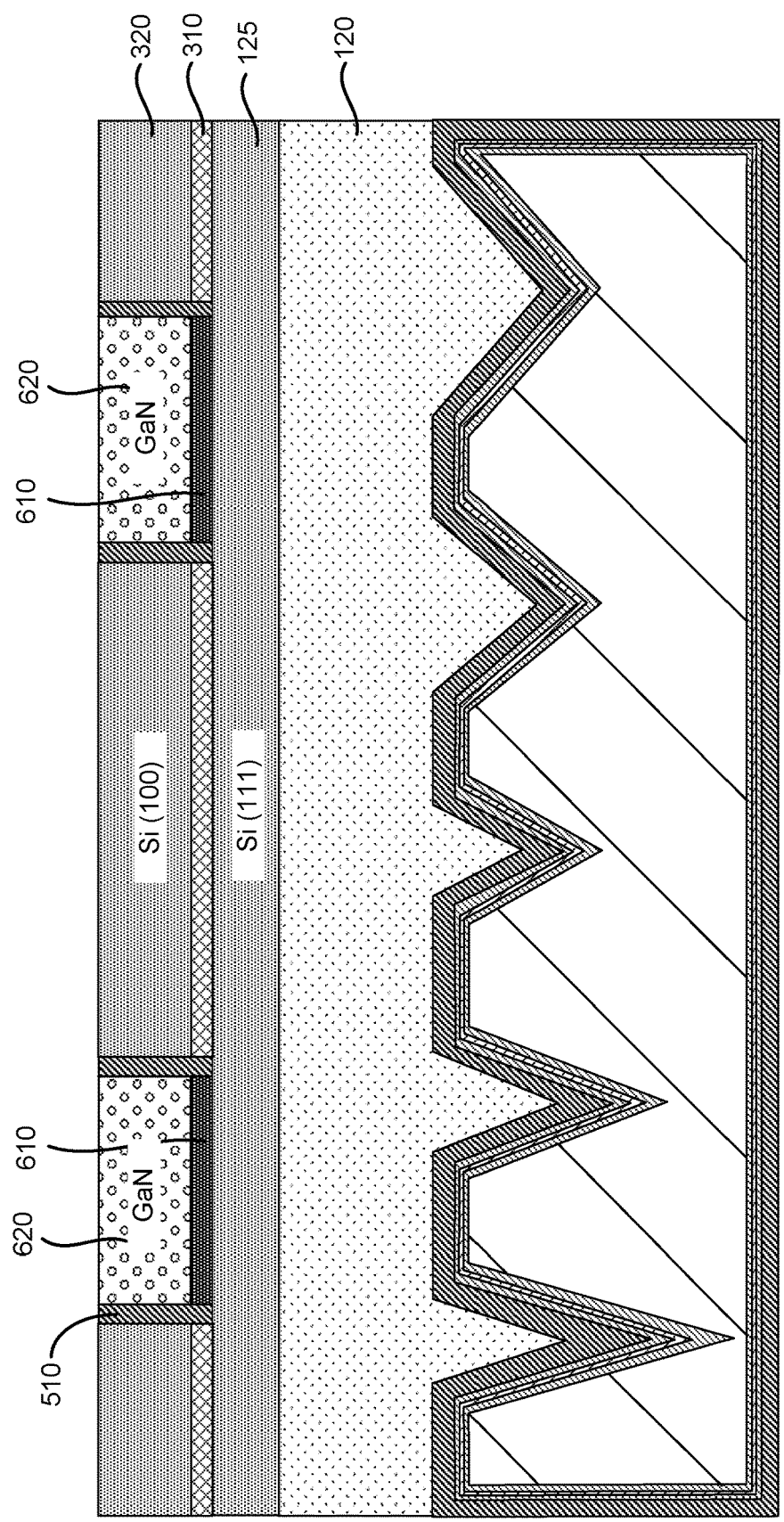
FIG. 6 is a schematic cross-sectional diagram illustrating an intermediate step of fabricating a semiconductor structure according to an embodiment of the present invention.

The method 200 may further include, at 212, forming a gallium nitride (GaN) layer 620 coupled to the exposed portion of the first silicon layer 125 (e.g., the (111) silicon layer) in each recess 410, as illustrated in FIG. 6. In some embodiments, a GaN buffer layer 610 is first formed on the exposed portion of the first silicon layer 310 by epitaxial growth before the GaN layer 620 is formed. The method 200 may further include stripping the hard mask 510 to expose the top of the remaining portion of the second silicon layer 320, as illustrated in FIG. 6. In some embodiments, the GaN buffer layer 610 and the GaN layer 620 may have a combined thickness of about 5 µm, about the same as the thickness of the second silicon layer 320 (e.g., the Si (100) layer), so that the surface of the GaN layer 620 is substantially co-planar with the surface of the remaining portion of the second silicon layer 320. The GaN layer 620 and the second silicon layer 320 is electrically isolated by the hard mask 510 disposed at the sidewalls of the recesses 410.

Figure 7:
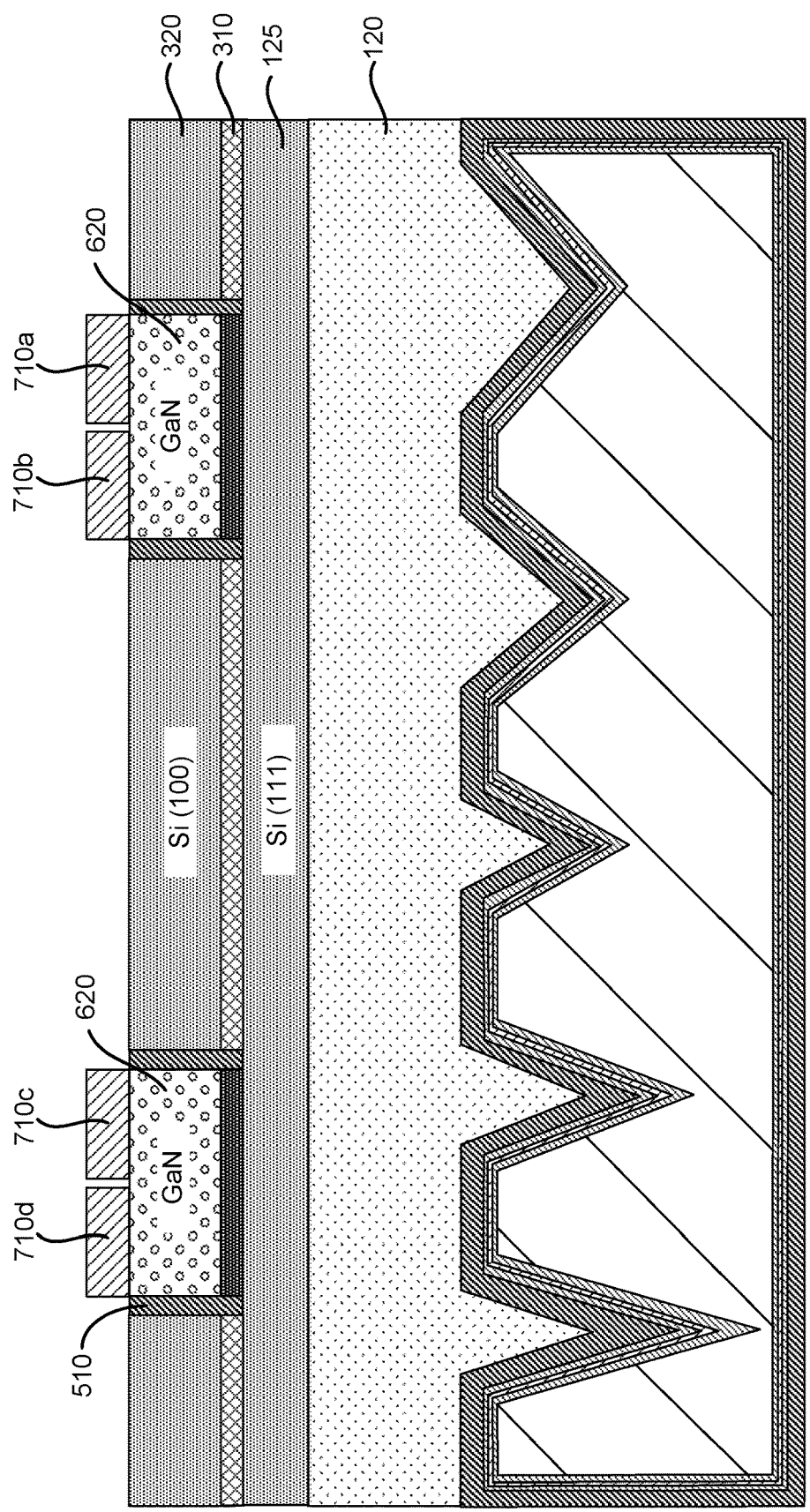
FIG. 7 is a schematic cross-sectional diagram illustrating an intermediate step of fabricating a semiconductor structure according to an embodiment of the present invention.
Figure 8:
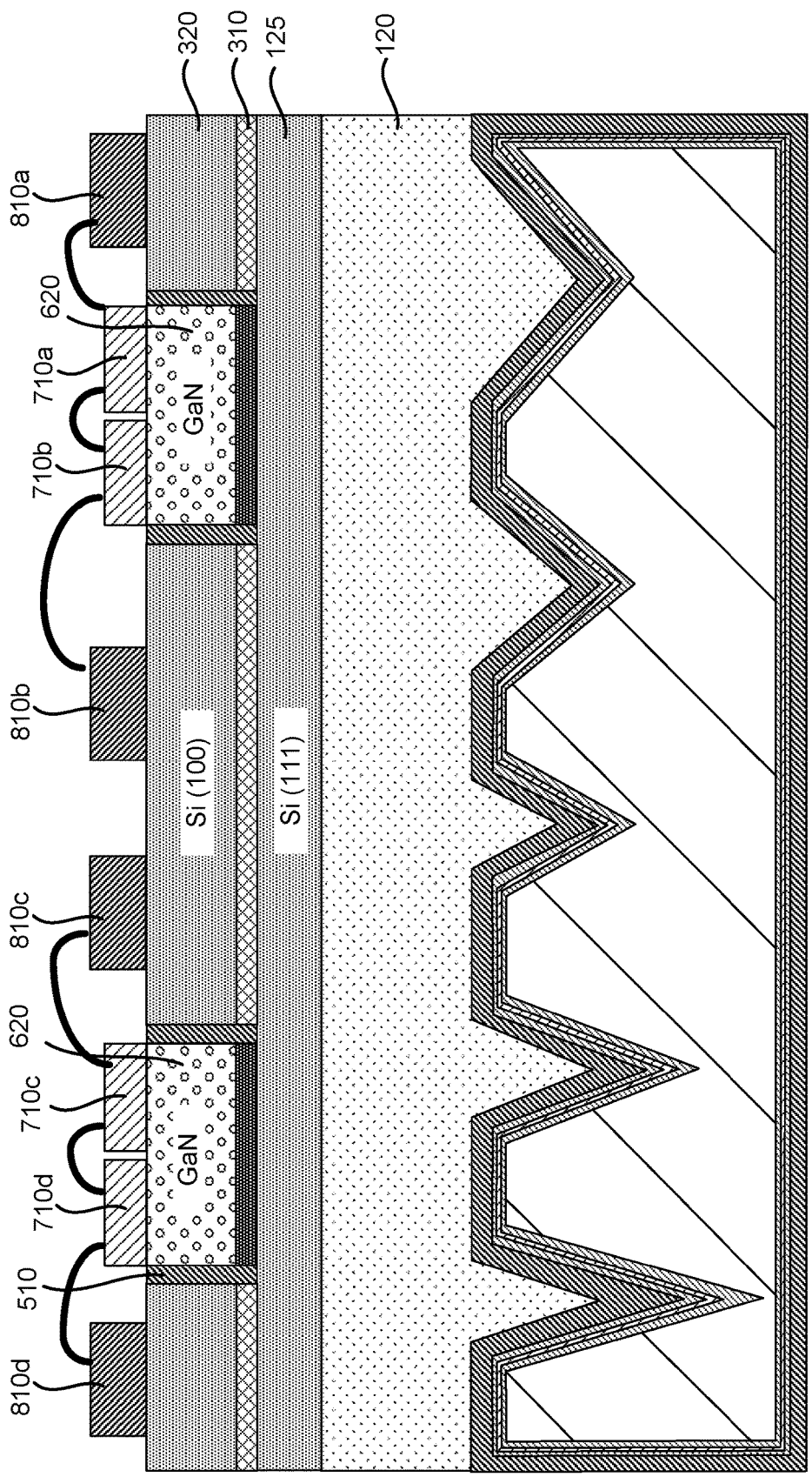
FIG. 8 is a schematic cross-sectional diagram illustrating an intermediate step of fabricating a semiconductor structure according to an embodiment of the present invention.

The method 200 may further include, at 214, forming one or more GaN based devices 710a-710d coupled to the GaN layer 620, as illustrated in FIG. 7. The GaN based devices 710a-710d may be formed by epitaxial growth. The method 200 may further include, at 216, forming one or more silicon based devices 810a-810d, such as complementary metal-oxide-semiconductor (CMOS) devices, coupled to the second silicon layer 320 (e.g., the (100) silicon layer), as illustrated in FIG. 8. The method 200 may further include forming interconnects connecting the GaN based devices 710 and the silicon based devices 810, as illustrated in FIG. 8. In this fashion, silicon based devices 810 and GaN based devices 710 may be integrated on a polycrystalline ceramic substrate in a co-planar manner. The GaN based devices 710 may include LEDs, power devices, or the like. The silicon based devices 810 may include driving circuits and controller logics for driving the LEDs or power devices.

It should be appreciated that the specific steps illustrated in FIG. 2 provide a particular method of fabricating a semiconductor structure according to an embodiment of the present invention. Other sequences of steps may also be performed according to alternative embodiments. For example, alternative embodiments of the present invention may perform the steps outlined above in a different order. Moreover, the individual steps illustrated in FIG. 2 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 9:
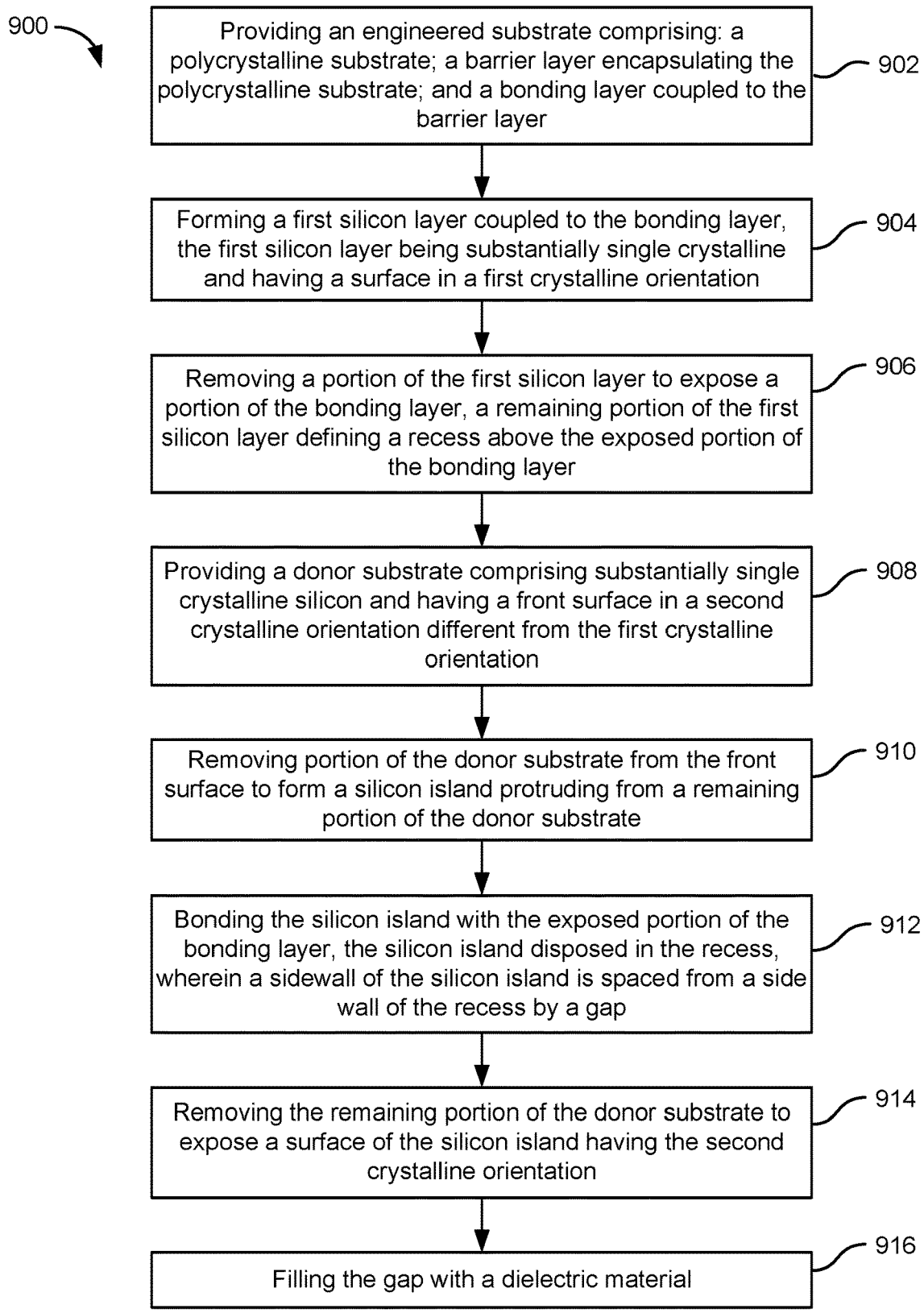
FIG. 9 is a simplified flowchart illustrating a method of fabricating a semiconductor structure according to another embodiment of the present invention.

FIG. 9 is a simplified flowchart illustrates a method 900 of fabricating a semiconductor structure according to another embodiment of the present invention. The method 900 includes, at 902, providing an engineered substrate. With reference to FIG. 1, the engineered substrate may include a polycrystalline ceramic core 110, a barrier layer 118 encapsulating the polycrystalline ceramic core 110, and a bonding layer 120 coupled to the barrier layer 118, as discussed above. The engineered substrate may further include one or more adhesion layers 112 and 116 (e.g., TEOS layers) and/or conductive layers 114 (e.g., polycrystalline silicon layers), as described above.

The method 900 may further include, at 904, forming a first silicon layer 125 coupled to the bonding layer 120, as illustrated in FIG. 1. The first silicon layer 125 may be substantially single crystalline and having a surface in a first crystalline orientation, such as the (111) orientation of silicon. The first silicon layer 125 may be formed by a layer transfer process in which a single crystal silicon layer is transferred from a silicon wafer, as discussed above.

Figure 10:
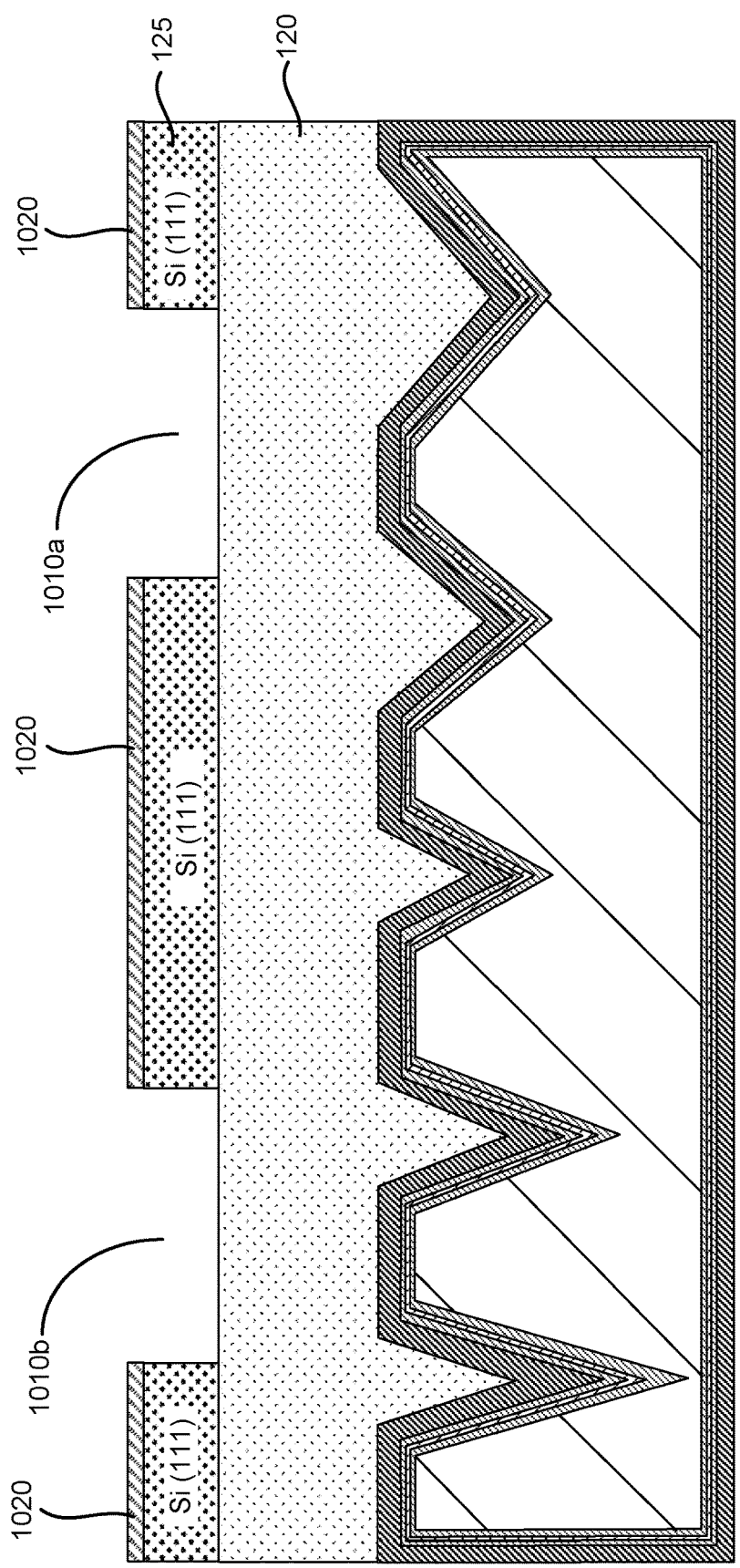
FIG. 10 is a schematic cross-sectional diagram illustrating an intermediate step of fabricating a semiconductor structure according to another embodiment of the present invention.

The method 900 may further include, at 906, removing one or more portions of the first silicon layer 125 to expose one or more portions of the bonding layer 120, as illustrated in FIG. 10. In some embodiments, a patterned photoresist layer 1020 is formed on the first silicon layer 125. The patterned photoresist layer exposes areas of the first silicon layer 125 to be removed. Then dry etching may be performed to remove the portions of the first silicon layer 125 not covered by the photoresist layer 1020. In some embodiments, wet etching, for example using KOH or TMAH, may be used to remove the portions of the first silicon layer 125 not covered by the photoresist layer 1020. Etching may be stopped at the bonding layer 120. The remaining portion of the first silicon layer 125 defines one or more recesses 1010a and 1010b that expose the portions of the bonding layer 120. The method 300 may further include removing the photoresist layer 1020 using a solvent after etching.

The method 900 may further include, at 908, providing a donor substrate 1100 as illustrated in FIG. 11A. The donor substrate 1100 may comprise substantially single crystalline silicon and have a front surface in a second crystalline orientation different from the first crystalline orientation of the first silicon layer 125. For example, the second crystalline orientation may be the (100) orientation of silicon. The method 300 may further include ion implanting the donor substrate to form an implant region 1102 near the front surface of the donor substrate 1100. In some embodiments, hydrogen implanting or hydrogen-helium co-implanting may be used. The method 300 may further include forming a patterned photoresist layer 1104 on the front surface of the donor substrate 1100. The patterned photoresist layer 1104 covers one or more portions of the front surface of the donor substrate 1100, as illustrated in FIG. 11B. The pattern of the patterned photoresist layer 1104 may be approximately a mirror image of pattern of the remaining portion of the first silicon layer 125 (e.g., the Si (111) layer) on the engineered substrate. The method 300 may further include, at 910, removing portions of the donor substrate 1110 that are not covered by the photoresist layer 1104 from its front surface by etching, thereby forming one or more silicon islands 1110a and 1110b protruding from the remaining portion of the donor substrate 1100, as illustrated in FIG. 11C.

Figure 12:
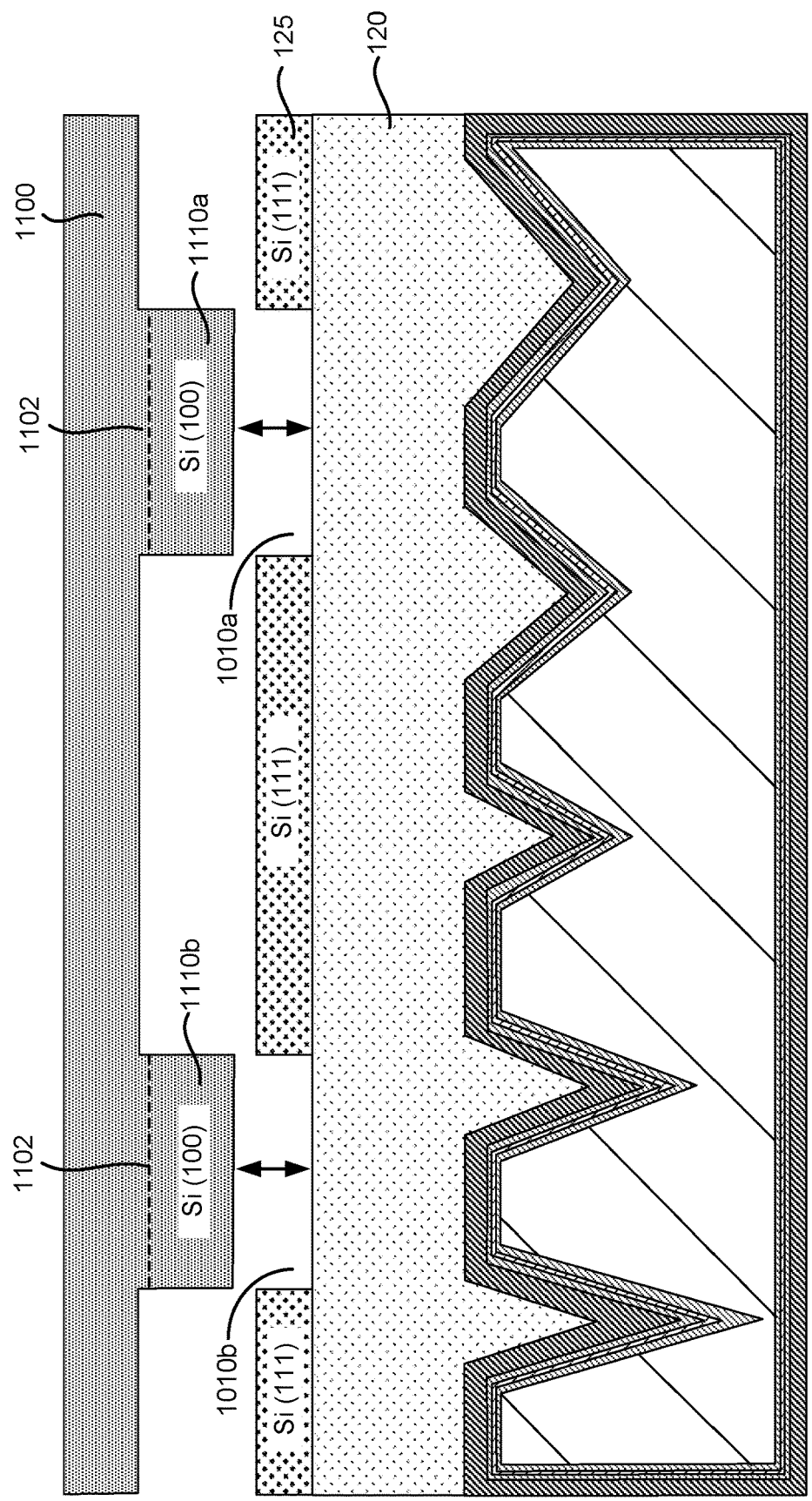
FIG. 12 is a schematic cross-sectional diagram illustrating an intermediate step of fabricating a semiconductor structure according to another embodiment of the present invention.
Figure 13:
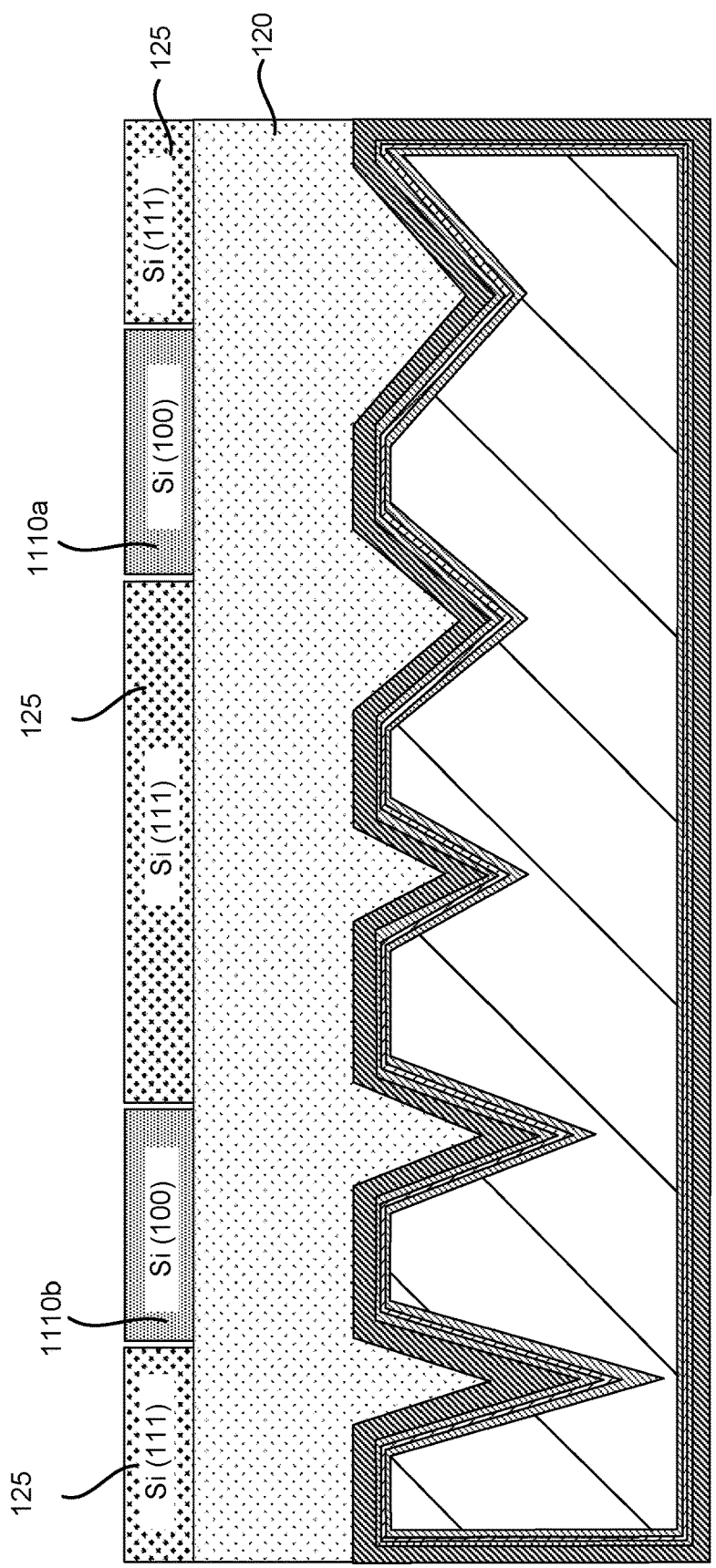
FIG. 13 is a schematic cross-sectional diagram illustrating an intermediate step of fabricating a semiconductor structure according to another embodiment of the present invention.

The method 900 may further include aligning the donor substrate 1100 to the engineered substrate such that each silicon island 1110a or 1110b is aligned with a corresponding recess 1010a or 1010b in the first silicon layer 125, as illustrated in FIG. 12. In some embodiments, each silicon island 1110a or 1110b has a lateral dimension that is smaller than that of the corresponding recess 1010a or 1010b, and a height that is greater than a depth of the recesses 1010a or 1010b, so that the silicon islands 1110a and 1110b may be interdigitated into the corresponding recesses 1010a and 1010b. The method 900 may further include, at 912, bonding the silicon islands 1110a and 1110b with the exposed portions of the bonding layer 120 in the corresponding recesses 1010a and 1010b, and at 914, removing the remaining portion of the donor substrate 1100 by fracturing the donor substrate 1100a t the implant region 1102. In this fashion, a plurality of silicon islands 1110a and 1110b with a (100) surface orientation may be formed in the recesses 1010a and 1010b of the remaining portion of the first silicon layer 125 with a (111) surface orientation, as illustrated in FIG. 13.

Figure 14:
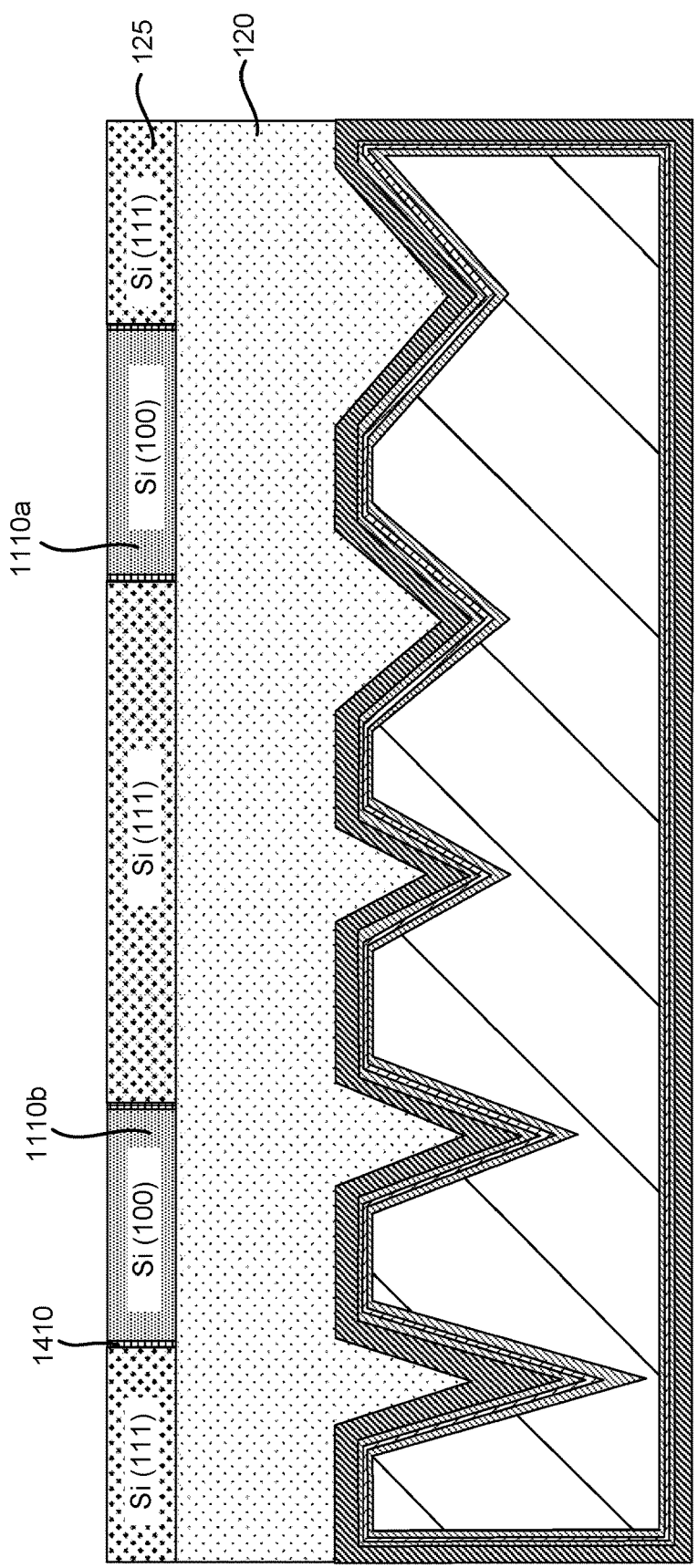
FIG. 14 is a schematic cross-sectional diagram illustrating an intermediate step of fabricating a semiconductor structure according to another embodiment of the present invention.

In some embodiments, the silicon (100) islands 1110a and 1110b may have a thickness that is approximately the same as the thickness of the silicon (111) layer 125 after the exfoliation step. There may be gaps between the silicon (100) islands 1110a and 1110b and the remaining portions of the silicon (111) layer 125, as clearances may be designed into the island layout to enable interdigitating of the donor substrate 1100 and the engineered substrate. The method 900 may further include, at 916, filling the gaps with a dielectric material 1410 so that each silicon (100) island 1110a or 1110b is electrically isolated with the silicon (1111) layer 125, as illustrated in FIG. 14. In some embodiments, the gap may have a width of about 0.1 µm. In some other embodiments, the gaps may have a width that is as narrow as 0.025 µm with precision alignment. Thus, the aspect ratio of the gaps may be about 10:1. Filling of the gaps with this aspect ratio may be readily achieved using, for example, copper through-silicon via (TSV) linear methods.

In some embodiments, the surfaces of the silicon (100) islands 1110a and 1110b and the silicon (111) layer 125 may be smoothed by thermal oxidation and selective oxide stripping. In some embodiments, the thickness of the silicon (100) islands 1110a and 1110b may range from about 0.3 µm to about 0.5 µm. A GaN layer may be epitaxially grown on the silicon (111) layer 125. The silicon (100) islands 1110a and 1110b may be thickened by epitaxial growth. In some embodiments, the method 900 may further include forming one or more GaN based devices on the GaN layer by epitaxially growth, forming one or more silicon based devices, such as CMOS devices, coupled to the silicon (100) islands 1110a and 1110b, and making interconnects connecting the GaN based devices with the silicon-based devices. Thus, silicon based devices and GaN based devices may be integrated on a polycrystalline ceramic substrate in a co-planar manner. The GaN based devices may include LEDs, power devices, or the like. The silicon based devices may include driving circuits and controller logics for driving the LEDs or power devices.

In some other embodiments, a GaN layer may be epitaxially grown on the silicon (111) layer 125, and one or more GaN based devices may be formed on the GaN layer by epitaxially growth before the silicon (100) islands 1110a and 1110b are inter-digitated with the silicon (111) layer 125. After the silicon (100) islands 1110a and 1110b are inter-digitated with the silicon (111) layer 125 with the GaN layer and GaN based devices formed thereon, one or more silicon based devices, such as CMOS devices, are formed on the silicon (100) islands 1110a and 1110b.

It should be appreciated that the specific steps illustrated in FIG. 9 provide a particular method of fabricating a semiconductor structure according to an embodiment of the present invention. Other sequences of steps may also be performed according to alternative embodiments. For example, alternative embodiments of the present invention may perform the steps outlined above in a different order. Moreover, the individual steps illustrated in FIG. 9 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 15:
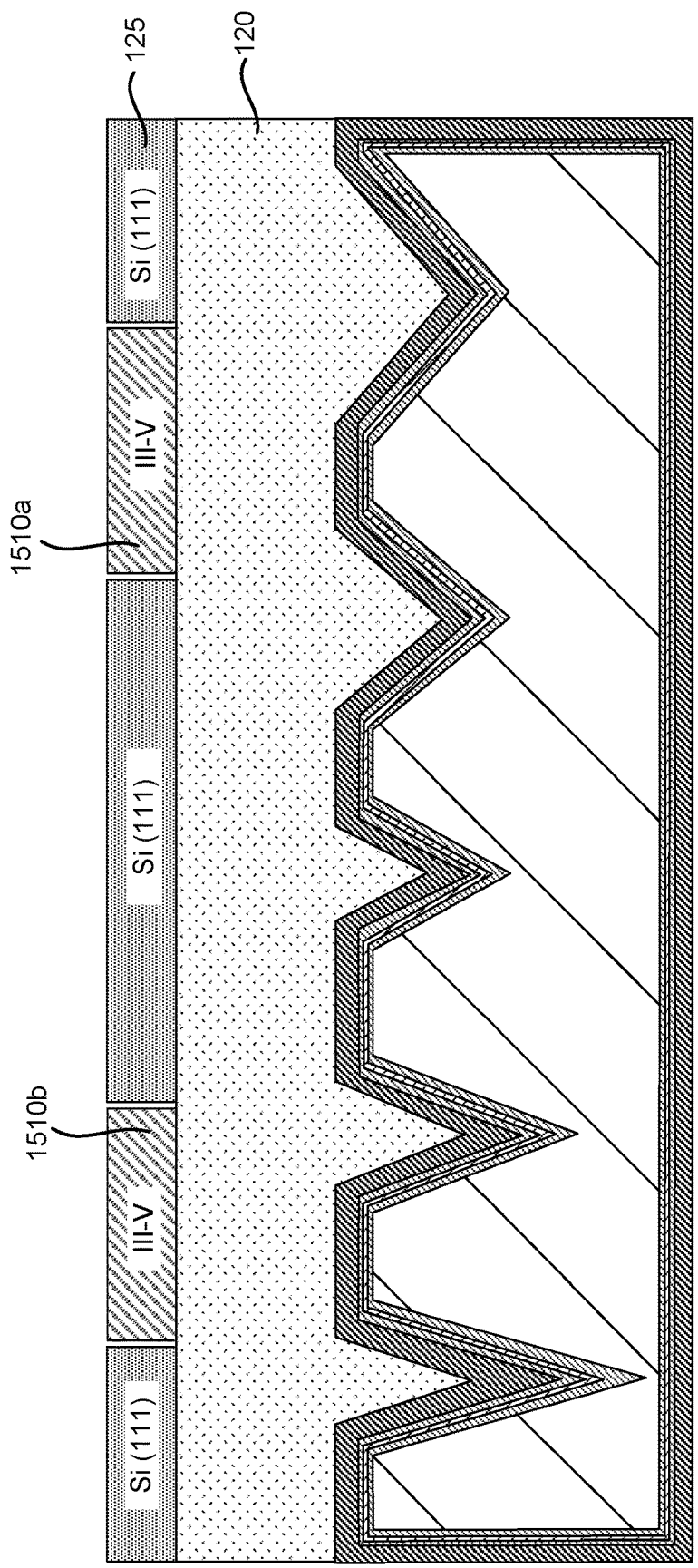
FIG. 15 is a schematic cross-sectional diagram illustrating a semiconductor structure according to an embodiment of the present invention.

FIG. 15 is a schematic cross-sectional diagram illustrating a semiconductor structure according to an embodiment of the present invention. Here, instead of preparing a patterned silicon (100) donor wafer, a patterned compound semiconductor donor wafer, such as a GaAs or other III-V donor wafer, is prepared, similar to the step 910 in the method 900. The patterned compound semiconductor donor wafer is then aligned and bonded with an engineered substrate with a patterned silicon (111) layer 125 thereon, similar to the step 912 in the method 900, to form an interdigitated pattern as illustrated in FIG. 15. The surfaces of the compound semiconductor islands 1510a and 1510b may be rough from the exfoliation step. Smoothing and planarization may be performed so that the compound semiconductor islands 1510a and 1510b may have approximately the same thickness as that of the silicon (111) layer 125. In some embodiments, the compound semiconductor islands 1510a and 1510b may be thickened by epitaxial growth. There may be gaps between the compound semiconductor islands and the silicon (111) layer due to lithography steps and alignment accuracy. Clearance may be designed into the island layout of the compound semiconductor donor wafer to enable interdigitating of the donor wafer and the engineered substrate. The gaps may be filled by a dielectric material to provide electrical isolation between the compound semiconductor islands 1510a and 1510b and the silicon (111) layer 125, similar to the step 916 of the method 900. One or more GaN based devices may be formed on the silicon (111) layer 125, and one or more III-V based devices may be formed on the compound semiconductor islands 1510a and 1510b. Interconnects may be made to connect the GaN based devices with the III-V based devices.

In some embodiments, a semiconductor structure may include an engineered substrate that comprises a polycrystalline substrate, a barrier layer encapsulating the polycrystalline substrate, and a bonding layer coupled to the barrier layer. The engineered substrate may further include one or more adhesion layers (e.g., TEOS layers) and/or conductive layers (e.g., polycrystalline silicon layers), as described above. The semiconductor structure may further include a semiconductor layer coupled to the engineered substrate. The semiconductor layer may include a substantially single crystalline silicon layer having a surface in a first crystalline orientation. The silicon layer may define a plurality of recesses exposing a plurality of portions of the bonding layer. The semiconductor layer may further include a plurality of compound semiconductor regions, each of the plurality of compound semiconductor regions being coupled to a respective exposed portion of the bonding layer in a respective recess. In some embodiments. The polycrystalline substrate includes polycrystalline aluminum gallium nitride (AlGaN). In some embodiments, each of the plurality of compound semiconductor regions comprises a III-V semiconductor, such as GaAs.

Figure 16:
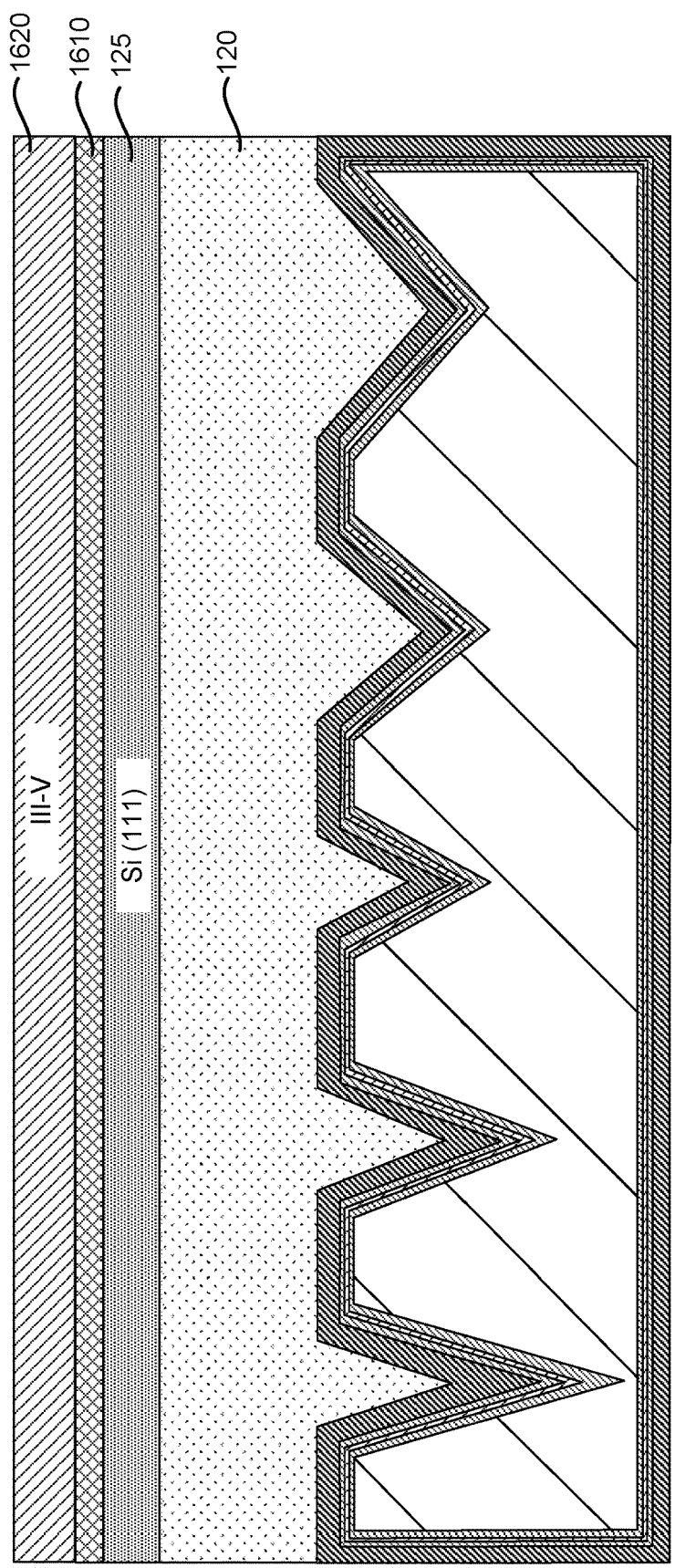
FIG. 16 is a schematic cross-sectional diagram illustrating an intermediate step of fabricating a semiconductor structure according to a further embodiment of the present invention.
Figure 17:
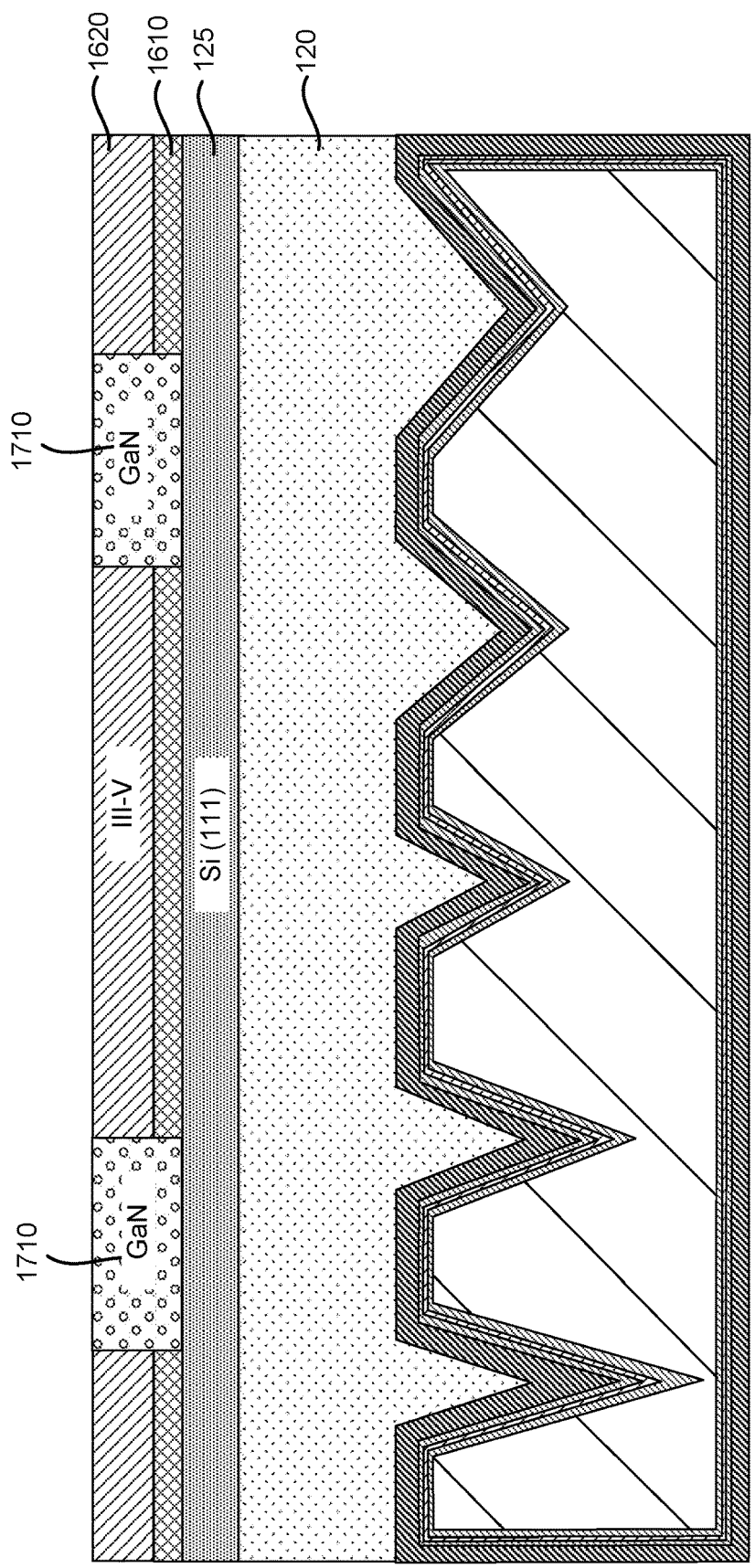
FIG. 17 is a schematic cross-sectional diagram illustrating an intermediate step of fabricating a semiconductor structure according to a further embodiment of the present invention.

FIG. 16 is a schematic cross-sectional diagram illustrating an integrated semiconductor structure according to an embodiment of the present invention. After the silicon (111) layer 125 is formed on the engineered substrate by exfoliation, a dielectric layer 1610 is formed on the silicon (111) layer 125 by thermal oxidation or other suitable methods. In some embodiments, the dielectric layer 1610 may have a thickness ranging from about 10 nm to about 20 nm. A III-V compound semiconductor layer 1620 (e.g., GaAs, GaP, InP, or the like) may be formed on the dielectric layer 1610 by exfoliation. The III-V compound semiconductor layer 1620 may be patterned by photolithography and etching to form a plurality of recesses exposing portions of the silicon (111) layer 125, similar to the step 210 of the method 200. A GaN layer 1710 may be formed in the plurality of recesses on the exposed portions of the silicon (111) layer 125, as illustrated in FIG. 17. Thus, a coplanar substrate may be obtained having a patterned GaN layer 1710 interdigitated with a III-V compound semiconductor layer 1620. The coplanar substrate may be suitable for integrating GaN based devices and III-V compound semiconductor devices.

Figure 18:
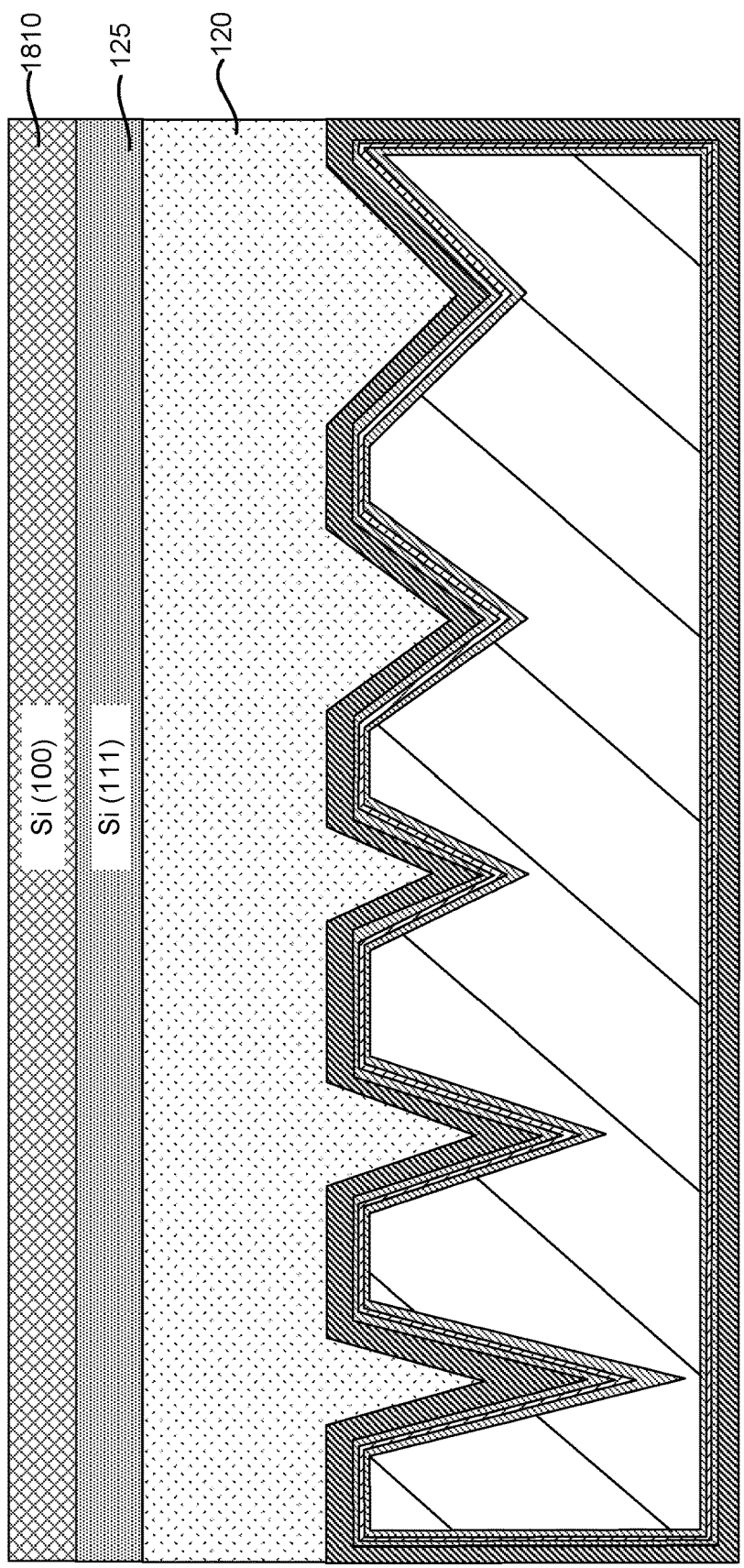
FIG. 18 is a schematic cross-sectional diagram illustrating a semiconductor structure according to another embodiment of the present invention.

FIG. 18 is a schematic cross-sectional diagram illustrating a semiconductor structure according to another embodiment of the present invention. Here, after the silicon (111) layer 125 is formed on the engineered substrate by exfoliation, similar to steps 202-204 of the method 200, a silicon (100) layer 1810 may be bonded to the silicon (111) layer 125 by suitable methods, such as hydrogen-helium implantation and plasma bonding, without a dielectric layer in between or alternatively with a very thin dielectric layer in between. In some cases, an ohmic contact may be formed between the silicon (111) layer 125 and the silicon (100) layer 1810. In cases where there is a very think dielectric layer 1610 between the silicon (111) layer 125 and the silicon (100) layer 1620, as illustrated in FIG. 16, conduction may be achieved through tunneling. In cases where the silicon (100) layer 1810 is bonded to the silicon (111) layer 125 without a dielectric layer, as illustrated in FIG. 18, some relatively small isolated islands of native oxide may be present at the interface between the silicon (111) layer 125 and the silicon (100) layer 1810. In those cases, tunneling may be possible through the native oxide islands. The semiconductor structure illustrated in FIG. 18 may provide a highly conductive heat transfer substrate suitable for integrating GaN based devices and silicon based devices.

Figure 19:
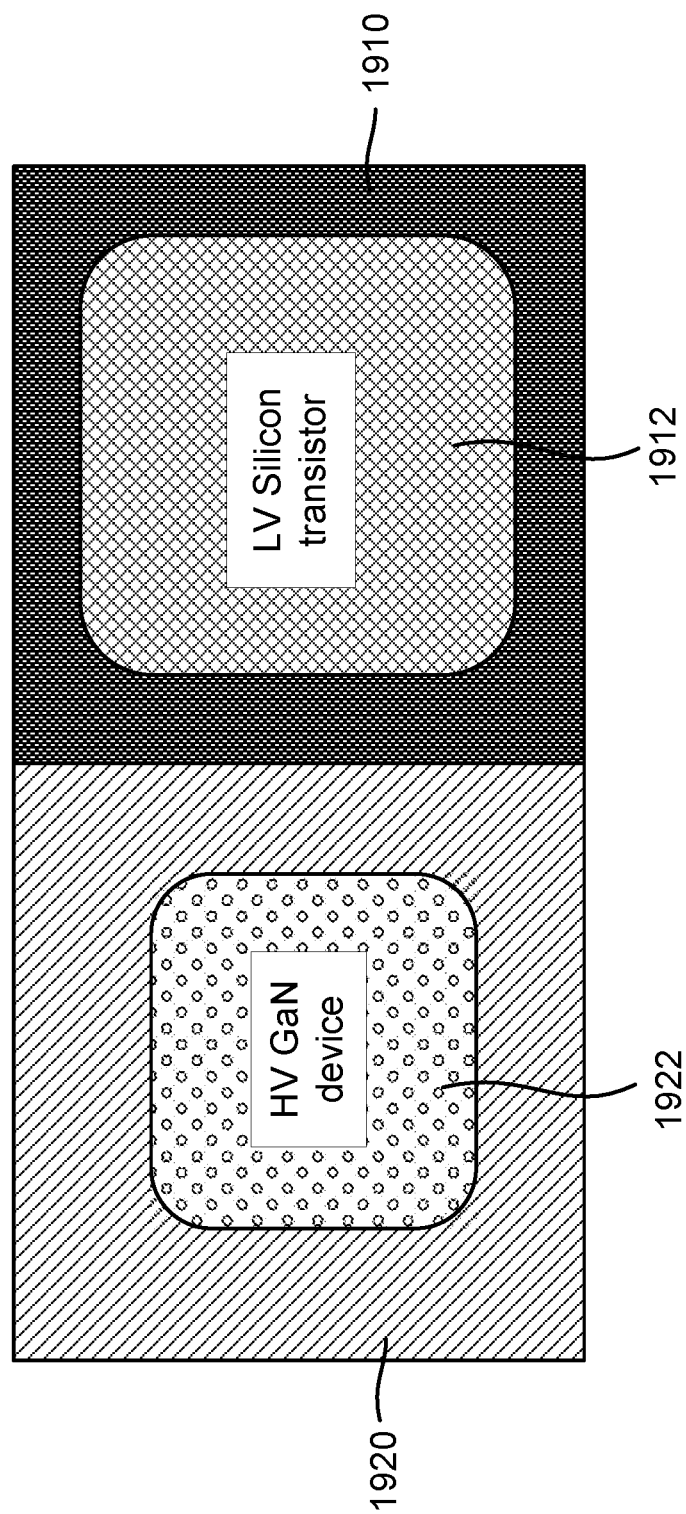
FIG. 19 is schematic plan view of an integrated semiconductor structure according to an embodiment of the present invention.

FIG. 19 is schematic plan view of an integrated semiconductor structure that includes a high-voltage (HV) gallium nitride (GaN) device 1922 and a low-voltage (LV) silicon transistor 1912 according to an embodiment of the present invention. The high-voltage (HV) GaN device 1922 and the low-voltage (LV) silicon transistor 1912 may be integrated in the same chip using one of the methods described above. For example, the The high-voltage (HV) GaN device 1922 may be formed on a silicon (111) layer 1920; and the low-voltage (LV) silicon transistor 1912 may be formed on a Si (100) layer 1910. The LV silicon transistor 1912 may serve as a driver circuit or a control circuit according various embodiments of the present invention.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method of fabricating a semiconductor structure, the method comprising:
    providing an engineered substrate, the engineered substrate comprising:
        a polycrystalline substrate;
        a first adhesion layer encapsulating the polycrystalline substrate;
        a conductive layer encapsulating the first adhesion layer; and
        a second adhesion layer encapsulating the conductive layer;
        a barrier layer encapsulating the second adhesion layer; and
        a bonding layer coupled to the barrier layer;
    forming a first silicon layer coupled to the bonding layer, the first silicon layer being substantially single crystalline and having a surface in a first crystalline orientation;
    forming a dielectric layer coupled to the first silicon layer;
    forming a second silicon layer coupled to the dielectric layer, the second silicon layer being substantially single crystalline and having a surface in a second crystalline orientation different from the first crystalline orientation;
    removing a portion of the second silicon layer and a corresponding portion of the dielectric layer to expose a portion of the first silicon layer, a remaining portion of the second silicon layer defining a recess above the exposed portion of the first silicon layer between sidewalls of the recess;
    forming a hard mask covering the sidewalls;
    forming a gallium nitride (GaN) layer coupled to the exposed portion of the first silicon layer in the recess;
    forming a gallium nitride (GaN) based device coupled to the GaN layer; and
    forming a silicon-based device coupled to the remaining portion of the second silicon layer.

2. The method of claim 1 wherein the polycrystalline substrate comprises polycrystalline aluminum gallium nitride (AlGaN).

3. The method of claim 1 wherein the first crystalline orientation is (111) orientation of silicon.

4. The method of claim 1 wherein the second crystalline orientation is (100) orientation of silicon.

5. The method of claim 1 wherein the silicon-based device comprises a complementary metal-oxide-semiconductor (CMOS) device.

6. The method of claim 1 further comprising forming an interconnect between the GaN based device and the silicon-based device.

7. The method of claim 1 wherein forming the GaN layer is by epitaxial growth of GaN on the exposed portion of the first silicon layer in the recess.

8. The method of claim 1 wherein forming the first silicon layer and forming the second silicon layer are performed by exfoliation.

9. The method of claim 1 wherein the GaN layer has a thickness greater than about 2 μm.

10. The method of claim 1 wherein each of the first adhesion layer and the second adhesion layer comprises tetraethyl orthosilicate (TEOS).

11. The method of claim 1 wherein the conductive layer comprises polysilicon.

12. A method of fabricating a semiconductor structure, the method comprising:
    providing an engineered substrate, the engineered substrate comprising:
        a polycrystalline substrate;
        a first adhesion layer encapsulating the polycrystalline substrate;
        a conductive layer encapsulating the first adhesion layer;
        a second adhesion layer encapsulating the conductive layer;
        a barrier layer encapsulating the second adhesion layer; and
        a bonding layer coupled to the barrier layer;
    forming a first silicon layer coupled to the bonding layer, the first silicon layer being substantially single crystalline and having a surface in a first crystalline orientation;
    removing a portion of the first silicon layer to expose a portion of the bonding layer, a remaining portion of the first silicon layer defining a recess above the exposed portion of the bonding layer;
    providing a donor substrate comprising substantially single crystalline silicon and having a front surface in a second crystalline orientation different from the first crystalline orientation;

removing a portion of the donor substrate from the front surface to form a silicon island protruding from a remaining portion of the donor substrate;

bonding the silicon island with the exposed portion of the bonding layer, the silicon island disposed in the recess, wherein a sidewall of the silicon island is spaced from a side wall of the recess by a gap;

removing the remaining portion of the donor substrate to expose a surface of the silicon island having the second crystalline orientation; and filling the gap with a dielectric material.

13. The method of claim 12 wherein the first crystalline orientation is (111) orientation of silicon, and the second crystalline orientation is (100) orientation of silicon.

14. The method of claim 12 further comprising:
forming a gallium nitride (GaN) based device coupled to the remaining portion of the first silicon layer; and
forming a silicon-based device coupled to the silicon island.

15. The method of claim 14 wherein the silicon-based device comprises a complementary metal-oxide-semiconductor (CMOS) device.

16. The method of claim 12 wherein the polycrystalline substrate comprises polycrystalline aluminum gallium nitride (AlGaN).

17. The method of claim 12 wherein the barrier layer comprises silicon nitride.

18. The method of claim 12 wherein each of the first adhesion layer and the second adhesion layer comprises tetraethyl orthosilicate (TEOS).

19. The method of claim 18 wherein the conductive layer comprises polysilicon.

* * * * *